United States Patent [19]

Kubota et al.

[11] Patent Number: 4,817,005

[45] Date of Patent: Mar. 28, 1989

[54] METHOD OF DESIGNING CUBIC RECEPTACLE AND APPARATUS THEREFOR

[75] Inventors: Yasuo Kubota, Tokyo; Nobumoto Kani, Kawaguchi; Kazutaka Okawa, Tokyo; Takuo Tobita, Tokyo; Tsuneo Miyasaka, Tokyo, all of Japan

[73] Assignee: Dai Nippon Insatsu Kabushiki Kaisha, Tokyo, Japan

[21] Appl. No.: 19,314

[22] PCT Filed: Jul. 5, 1986

[86] PCT No.: PCT/JP86/00347

§ 371 Date: Mar. 18, 1987

§ 102(e) Date: Mar. 18, 1987

[87] PCT Pub. No.: WO87/00320

PCT Pub. Date: Jan. 15, 1987

[30] Foreign Application Priority Data

| Jul. 5, 1985 | [JP] | Japan | 60-146585 |
| Jul. 8, 1985 | [JP] | Japan | 60-149765 |
| Jul. 11, 1985 | [JP] | Japan | 60-152781 |
| Jul. 12, 1985 | [JP] | Japan | 60-153419 |
| Jul. 13, 1985 | [JP] | Japan | 60-154835 |
| Jul. 13, 1985 | [JP] | Japan | 60-154836 |
| Jul. 24, 1985 | [JP] | Japan | 60-163708 |

[51] Int. Cl.$^4$ ..................... G06F 15/46; G06F 15/626
[52] U.S. Cl. ..................... 364/468; 340/701; 340/723; 364/188; 364/521; 364/564
[58] Field of Search ............... 364/468, 471, 512, 518, 364/521, 522, 514, 564, 191-193, 188, 189; 425/175; 382/8, 20, 44-47, 58, 59; 340/715, 716, 721-727, 747, 792, 701

[56] References Cited

U.S. PATENT DOCUMENTS

| 4,155,072 | 5/1979 | Kawa | 382/45 |
| 4,475,104 | 10/1984 | Shen | 364/521 X |
| 4,506,336 | 3/1985 | Hird | 364/520 X |
| 4,523,270 | 6/1985 | Kishi et al. | 364/191 |
| 4,641,270 | 2/1987 | Lalloz et al. | 364/468 X |
| 4,685,070 | 8/1987 | Funchbaugh | 364/518 X |

FOREIGN PATENT DOCUMENTS

| 125649 | 10/1975 | Japan. |
| 127034 | 10/1977 | Japan. |
| 79326 | 7/1978 | Japan. |
| 64038 | 5/1980 | Japan. |
| 231675 | 12/1984 | Japan. |
| 68474 | 4/1985 | Japan. |
| 81682 | 5/1985 | Japan. |
| 126771 | 7/1985 | Japan. |

Primary Examiner—Joseph Ruggiero
Attorney, Agent, or Firm—Parkhurst, Oliff & Berridge

[57] ABSTRACT

A method of designing a cubic receptacle which determines the form of the receptacle in consideration of an internal capacity of the receptacle or an amount of material required for manufacturing the receptacle to prepare a two-dimensional pictorial image of the receptacle of which form is thus determined with a label being attached thereon to appraise the pictorial image thus obtained. To carry out the above design, a computer and various input/output units are used.

In addition, a designing method particularly suitable for determining the form of a receptacle of body of revolution. Such a determination of the form is made using a coordinate input unit.

Moreover, a technique is provided for representing a three-dimensional body in a two-dimensional manner, especially to a techique for representing a cubic receptacle on which a label is attached in a two-dimensional manner. In addition, a special algorithm is used for representing an impression of material quality of the receptacle.

Further, a method of forming vector data of special character font suitable for a work for attaching a label including character on a cubic receptacle.

39 Claims, 27 Drawing Sheets (ROTATIONAL AXIS)

(ROTATIONAL AXIS)

(ROTATIONAL AXIS)

(1)          (2)

(1)          (2)

(3)

FIG. 48(a)
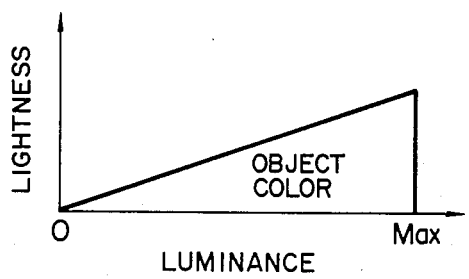
FIG. 48(b)
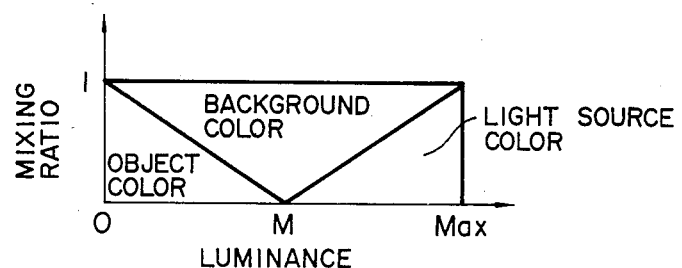
FIG. 49
FIG. 50
| 2W | | 1B | 2W | |
|---|---|---|---|---|
| 2W | | 1B | | |
| 1B | 1W | 1B | 1W | 1B |
| 1B | 1W | 1B | 1W | 1B |
| 5B | | | | |

FIG. 51
| '4' X |
|---|
| '4' X |
| '15' X |
| '15' X |
| '1F' X |
FIG. 52(a)
FIG. 52(b)
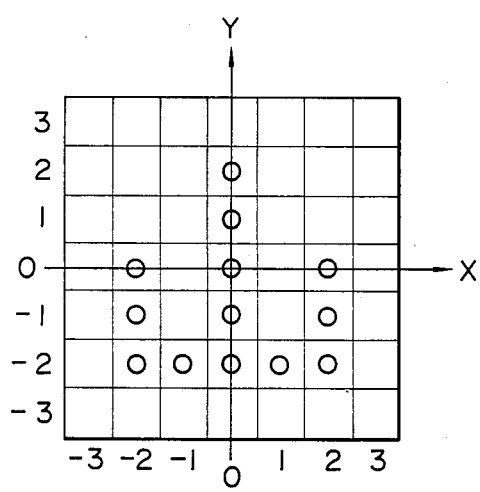
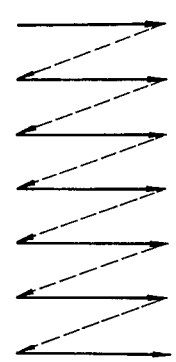

METHOD OF DESIGNING CUBIC RECEPTACLE AND APPARATUS THEREFOR

TECHNICAL FIELD

The present invention relates to a method of designing a cubic receptacle and an apparatus therefor, and more particularly to a method of designing a cubic receptacle and an apparatus therefor to determine the form of the receptacle in consideration of an internal capacity of the receptacle or an amount of material required for manufacturing the receptacle, to prepare a two-dimensional pictorial image of the receptacle of which form is thus determined with a label being attached thereon, and to appraise the pictorial image thus obtained.

BACKGROUND ART

Cubic receptacles or containers are extensively used in order to package various goods including foods and drinks. Ordinarily, these receptacles are formed with synthetic resin materials and labels indicating trade name or trade mark etc. are attached thereon. Conventionally, when designing receptacles of this type, there is employed a method to conduct desk work based on drafting and calculating the capacity and the amount of the resin material, thereaft-er to actually manufacture products.

A conventional process for designing such cubic receptacles is shown in FIG. 1. First, planning 1 is presented by a person who gives an order for an receptacle, and condition setting/information gathering 2 is conducted. Then, idea development 3 is carried out while repeating condition setting/information gathering 2. After narrowing down of design in regard to the receptacle form, rendering manufacture 5 in regard to the design is conducted. At this stage, presentation 6 for presenting the design to the person who has given the order is carried out. If restudying or reexamination is required, the process is repeated from the idea development 3 for a second time.

Here, in the process where the final form is determined, various components, i.e., height, width, taper and capacity constituting the form are diversely combined to reach the optimum combination. Every time these respective components are changed, a new drafting will be conducted. Such drafting works require a great deal of labor and time.

At the stage where the design has been determined, various processes, e.g., moldability studying 7, material quality studying 8, manual calculation of capacity 9, determination of dimension 10, and coloring study 11 etc. are implemented. If there is any problem, restudying will be repeated. For instance, if the capacity is not equal to a designated value, the design of the entirety of the form must be altered. Accordingly, the same procedure must be repeated from the moldability studying 7 for a second time, with the result that a considerable labor will be spent until the form is determined. When the final form is determined by repeating such studying processes, trial manufacturing of model 12 is carried out at last. This is a process to actually implement trial manufacturing of a cubic object or body as designed using a wooden model etc. Subsequently, the model trially manufactured is presented to the person who has given the order to request for studying 13. In the case where the person who has given the order has judged that the resudying is required, processes from the moldability, studying 7 to the model trial manufacturing 12 will be repeated. By the time a satisfactory model is completed, considerable labor and time are required.

When the satisfactory model is completed and the final form is determined, drafting of metal mold drawing 14 of the cubic form is carried out. Subsequently, surface design studying 15 is conducted. Namely, study on pattern design attached on the receptacle surface is carried out and a design dummy manufacturing 16 in regard to the completed pattern is conducted. Thus presentation 17 for presenting it to the person who has given the order is carried out. If restudying is required at this stage, the study on surface design 15 is repeated again. When the final determination 18 satisfactory to the person who has given the order is made, manufacturing of the receptacle 19 is carried out. A series of processes up to delivery or supply of goods 20 are thus completed.

As stated above, with the conventional method of designing cubic receptacles, studying by a person who has given the order is carried out per each process, and when restudying is required, the process of the question must be repeated for a second time. Thus, such a conventional method has the drawback that much labor and time are required.

DISCLOSURE OF THE INVENTION

A first object of the present invention is to provide a method of designing a cubic receptacle and an apparatus therefor which can lessen labor and time.

A second object of the present invention is to provide an apparatus which can determine the form of a cubic receptacle in consideration of an internal capacity of the cubic receptacle or an amount of material for forming the receptacle using a computer.

A third object of the present invention is to provide a method to input an original picture of a label to be attached on a cubic receptacle, thus making it possible to obtain a pictorial image as the two-dimensional representation of the cubic receptacle with the label being attached thereon.

A fourth object of the present invention is to provide a method of representing an impression of material quality wherein when representing a three-dimensional figure in a two-dimensional manner, the method can represent a more faithful impression of material quality and can represent an impression of material quality partially different.

A fifth object is to provide a method of forming a character font which can arbitrarily alter the form or size of character font using less data capacity so as to suit the handling of characters of a label when representing a cubic receptacle with a label being attached thereon in a two-dimensional manner.

To achieve these objects, the present invention is constituted as featured below.

The first feature of the present invention resides in a method of designing a cubic receptacle, the method comprising the steps of inputting a cross section of the cubic receptacle as two-dimensional data, displaying a two-dimensional projected image of the cubic receptacle and calculating the capacity thereof on the basis of the two-dimensional data thus input, making a correction of the cross section of the cubic receptacle on the basis of the result to determine the final form of the receptacle, inputting an original picture of a label attached on the surface of the cubic receptacle as two-dimensional data, displaying the label on the basis of the two-dimensional data thus input, carrying out correction of the label or coloring processing therefor to determine the final label to link data of the final form of the receptacle with the data indicative of the final label thereby to output a two-dimensional projected image of the cub{c receptacle on which the label is attached, thus to lessen labor and time required for design.

The second feature of the present invention resides in an apparatus for designing a cubic receptacle, which is composed of a coordinate input unit wh,:ch inputs a cross section of the cubic receptacle as two-d}mensional coordinates, a label input unit which inputs an original picture of a label attached on the surface of the cubic receptacle as pictorial image data, a display unit which displays a two-dimensional projected image of the cubic receptacle, two-dimensionalpprojected images of the label and the cubic receptacle on which the label is attached, and other instructions necessary for an operator, a line drawing output unit which outputs the two-dimensional projected image of the cubic receptacle as a line drawing, a color hard copy unit which outputs with color representation two-dimensional projected image of the label or the cubic receptacle on which the label is attached, and a processing unit which performs a predetermined computation on the basis of data input from the coordinate input unit and the label input unit to provide data necessary for the display unit, the line drawing output unit and the color hard copy unit, thus lesseninglabor and the time required for design.

The third feature of the present invention resides in the provision of an apparatus in which a coordinate input unit which inputs position data such as cross sectional form of the receptacle, a numerical value input unit which inputs numeric data such as a receptacle thickness and a display are coupled to a computer, thereby to determine an internal capacity of the receptacle and an amount of material required for manufacturing the receptacle in correspondence with various inputs.

The fourth feature of the present invention resides in the provision of an apparatus for determining the form of a receptacle using a computer in which the apparatus is composed of a coordinate input unit which inputs position data of any element constituting the cross sectional form of the receptacle, a numerical value input unit which inputs numeric data, e.g., an internal capacity of the receptacle, a change in the above element or the like, a processing unit which calculates coordinate values on the basis of inputs from both the input units, and a unit which receives an output from the processing unit to display the form of the receptacle.

The fifth feature of the present invention resides in a two-dimensional representing method for a cubic receptacle on which a pattern is attached, the method comprising the steps of: dividing the surface of the cubic receptable into a plurality of infinitesimal surfaces; calculating luminance ff each infinitesimal surface when light is irradiated under a predetermined condition using a predetermined light source; projecting the cubic receptacle divided into a plurality of infinitesimal surfaces on a two-dimensional plane; inputting a pattern attached on the cubic receptacle as binary pictorial image; dividing the pattern thus input into a plurality of infinitesimal surfaces so as to correspond to the respective infinitesimal surfaces of the cub:c receptacle with one-to-one relationship when the input pattern is attached on the cubic receptacle; giving color numbers indicating background to infinitesimal surfaces of the background portion of the pattern and giving color numbers indicating colors of portions except for the background portion thereto; determining a color value in respect of the portion at which the pattern is not attached and the portion at which the infinitesimal surface of the pattern, to which a color number indicating the background is given, is attached on the basis of at least a receptacle body color and luminance of the infinitesimal color among respective infinitesimal surfaces of the projected cubic receptacle, and determining a color value in respect of the portion at which the infinitesimal surface, tto which a color number indicating color is given, is attached on the basis of at least luminance and the color number of the last-mentioned infinitesimal surface thereamong; and giving a color value to each infinitesimal surface constituting the cubic receptacle projected on the two-dimensional plane to represent the cubic receptacle as two-dimensional color image, thus coloring the pattern input as the binary pictorial image, and making it possible to apply two-dimensional representation to the cubic receptacle with the background portion of the pattern being erased.

The sixth feature of the present invention resides in displaying a two-dimensional pictorial image inputted from a pictorial image input unit on a display unit, effecting wire frame display of a primitive figure based on three-dimensional data on the displayed pictorial image, thereafter applying figure conversion only to the primitive figure in accordance with the input conditions to allow the primitive figure to be adapted to the two-dimensional pictorial image, forming a two-dimensional projected image of the primitive figure on the basis of the input condition obtained when it is judged that the primitive figure and the two-dimensional pictorial image are adapted to each other, and composing the two-dimensional projected image and the two-dimensional pictorial image to form an image.

The seventh feature of the present invention resides in a method of representing an impression of material quality when representing a three-dimensional figure having a predetermined body color placed in a space having a predetermined background in a two-dimensional manner, the method comprising the steps of dividing the surface of the three-dimensional figure into a plurality of infinitesimal surfaces, calculating luminance of each infinitesimal surface when light is irradiated under a predetermined condition using a predetermined light source by using background light component, diffusion reflection component and specular reflection component inherent in the material quality as parameters, and evaluating an intermediate value of the luminance from the calculated result, wherein when luminance is smaller than the intermediate value, infinitesimal surfaces of an opaque material quality in which the diffusion specular component and the specular reflection component are nearly equal to each other are represented using a body color having lightness corresponding to the luminance value, while when luminance is larger than the intermediate value, they are represented using a mixed color obtained by mixing light source color of the light source with the material color in accordance with the luminance value, wherein infinitesimal surfaces of opaque material quality in which diffusion reflection component and specular reflection component are different to some extent are represented by using body color having lightness corresponding to luminance value, wherein when infinitesimal surfaces have transparent material quality, infinitesimal surfaces having luminance larger than the intermediate value are represented as a mixed color of light source color of the light source with background color of the background, and infinitesimal surfaces having luminance lower than the intermediate value are represented as a mixed color of the material color with the background color, such a representation being performed so that the ratio of the light source color is increased according as luminance becomes higher and the ratio of the material color is increased according as luminance becomes lower, thereby replacing the three-dimensional figure with two-dimensional pictorial image having an impression of material quality, thus making it possible to realize representation having more faithful impression of material quality, and to realize representation having an impression of material quality partially different.

The eighth feature of the present invention resides in an attention to the fact that vector data has less data quantity and is suitable for geometrical conversion processing to scan raster data of characters per each line to take out coordinate values of the X-Y coordinate system with respect to the origin set on the character of the initial and terminal points in regard to only the character poriion, thus to change them to vector data.

BRIEF DESCRIPTION OF THE DRAWINGS

FIG. 47 and FIGS. 48(a) and 48(b) are graphs showing a color determination method based on a method according to the present invention;

FIGS. 49 to 51 are explanatory views showing one example of a conventional character font format; and FIG. 52(a) is a view for explaining raster data of a character which are converted to vector data;

FIG. 52(b) is a view for explaining a scanning method in a vector data conversion processing based on raster data scanning in the present invention.

BEST MODE OF CARRYING OUT THE INVENTION

The present invention will be explained on the basis of embodiments shown.

<Best mode in regard to the designing method>

Figure 2:
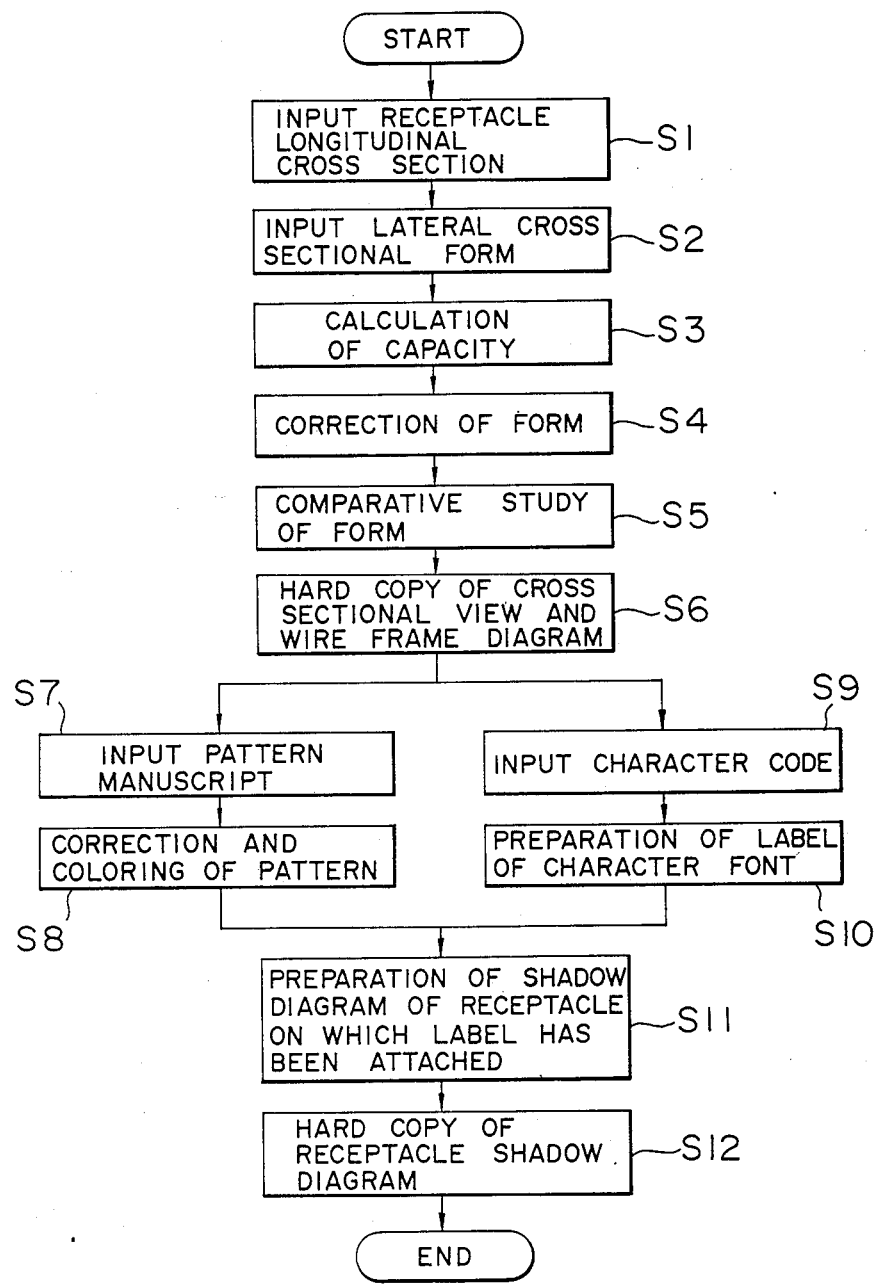
FIG. 2 a flowchart illustrating one embodiment according to the, present invention.
Figure 3:
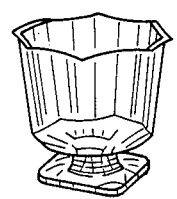
FIGS. 3, 4, 5a, 5b and 6 are explanatory views showing one example of a cross sectional form inputting method based on a method according to the present invention, respectively.
Figure 4:
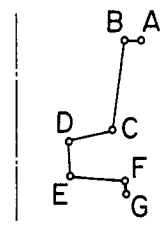
Figure 5A:
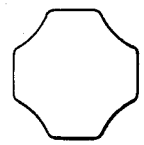
Figure 5B:
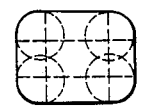

FIG. 2 is a flowchart showing an embodiment of a method according to the present invention. In accordance with this embodiment, the first object of the present invention is achieved. Initially, at step S1, longitudinal cross section of a receptacle is input to a computer. Namely, the longitudinal cross section of a cubic receptacle to be designed is taken in as two-dimensional data. When the receptacle is a symmetric one such as a body of revolution, it is sufficient to only input two-dimensional coordinates of the right half or left half of the cross section. For instance, when designing a cubic receptacle as shown in FIG. 3, it is sufficient to input a longitudinal cross section of only the right side with respect to the center line (indicated by single dotted lines) as shown in FIG. 4. At this time, it is enough to designate points A to G in the two-dimensional coordinate system as shown in FIG. 4 to give an instruction so as to connect these respective points using a straight line or a curve. Subsequently, at step S2, the form of the lateral cross section is input. When the cubic receptacle is a complete body of revolution, the input of the form of the lateral cross section is not required. However, in the case of the receptacle which is not a body of revolution as shown in FIG. 3, it is necessary to input the form of the lateral cross section in respect to respective portions in the longitudinal cross sectional view shown in FIG. 4. Thus, forms of the respective portions are input on the basis of the longitudinal cross section shown in FIG. 4. For instance, it is instructed that the receptacle has a lateral cross section formed as shown in FIG. 5(a) with respect to the segments from points A to D and has a lateral cross section formed as shown in FIG. 5(b) with respect to the segments from points D to G. There are various methods of instructing the form of the lateral cross section. For instance, when the concerned portion is a body of revolution, it is sufficient to solely designate that the lateral cross section is formed circular. Moreover, in the case of the form as shown in FIG. 5(a), it is sufficient to give an equation in respect of the figure thus formed. With respect to forms commonly used, it is effective to register them as the data base. In addition, in the case of the form as shown in FIG. 5(b), such a form can be defined by designating the combination of circle and rectangle. This may be accomplished by carrying out a drafting using a drafting instruction of the elementary geometrical figure such as circle or square on a display, for example. An operator can determine the form of the lateral cross section by carrying out a drafting on an interactive basis while observing the display. When lateral cross sectional forms of respective portions are thus input, the three-dimensional form of the cubic receptacle is determined. For instance, the lateral cross sectional forms at points D and E may be designated thus to make a designation such as to connect these points D and E using a straight line or a smooth curve.

Figure 6:
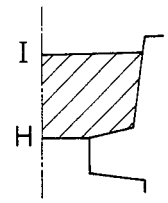

When the three-dimensional or cubic form is determined, capacity calculation is performed at step S3. This may be accomplished, for example, as shown in FIG. 6 by giving positions of a lower level H and an upper level I between which a material to be contained is occupied to designate a range to be calculated such as indicated by slanting lines in the figure. Then, correction of the form is made at step S4. This may be performed, for example, by displaying the cross sectional form on a display to give an input for changing the cross sectional form so as to become equal to the capacity as designated. In addition, at step S5, the two-dimensional projected image of the cubic receptacle is displayed on the display on the basis of the above-described cross sectional form to conduct a comparative study on the form to give an input to change the form, when needed. Upon determination of the form, hard copies of a cross sectional view and a wire frame diagram are output to study them at step S6.

Subsequently, a procedure for preparing a label attached on the receptacle surface is conducted. Namely, at step S7, a manuscript of the portion of the pattern among label manuscripts made up by a designer is input to a computer as two-dimensional data. The pattern is displayed on the display on the basis of the data thus input to conduct correction and coloring of the pattern. Such a coloring may be effected, for example, by dividing the pattern into several areas to carry out coloring designation per each area. On the other hand, the character portion of the label manuscript is input as character code at step S9. On the basis of the character code thus input, at step S10, a label of the corresponding character font is made up. In a manner stated above, the portion of the pattern and the character portion are independently input. They are finally composed and the label is thus completed. When the correction and composition of the label are completed, data of the cross sectional form and data of the label are linked to prepare a shadow diagram of the receptacle after the label is attached to display it on the display at step S11. If correction is further required at this time, the operation may return to the preceeding step to repeat the correction. Finally, at step S12, a hard copy of the shadow diagram of the receptacle on which the label is attached is output.

As stated above, in accordance with the designing method according to the present invention, the cross section of the cubic receptacle and the label attached thereon are input to the computer as two-dimensional data to apply a necessary correction to them, thereafter to link these data to output the two-dimensional projected image of the cubic receptacle on which the label is attached, thus making it possible to lessen labor and time required for design.

<Best mode in regard to the designing apparatus>

Figure 7:
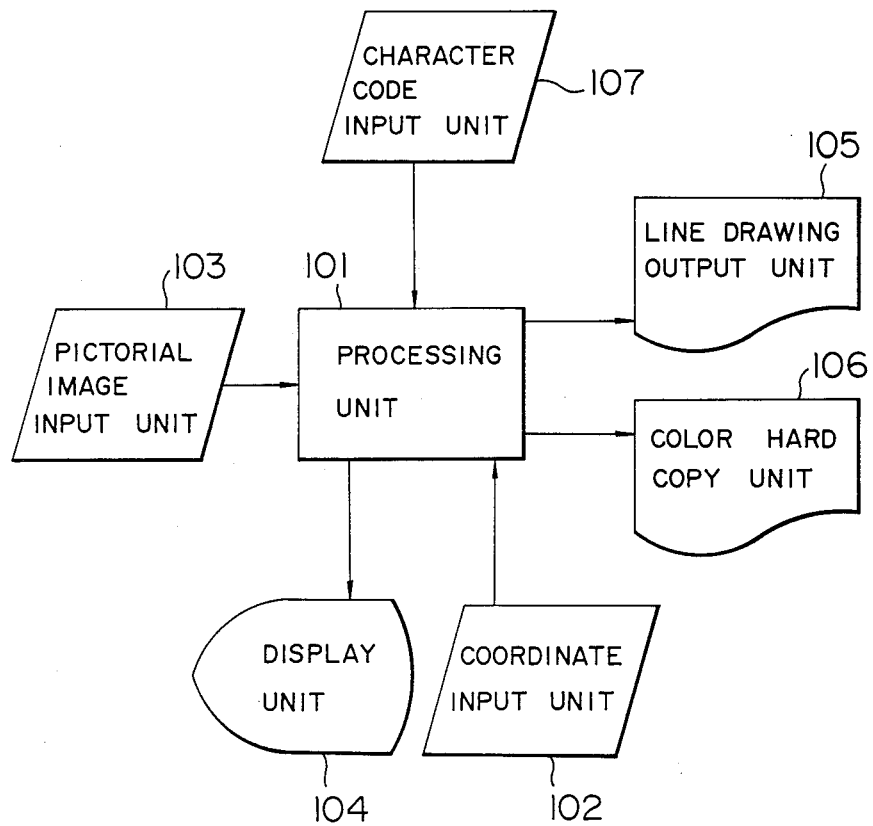
FIG. 7 is a block diagram illustrating an embodiment of an apparatus according to the present invention.

FIG. 7 is a block diagram illustrating the arrangement of an apparatus according to the present invention. In accordance with this embodiment, the first object of the present invention is achieved. For a processing unit 101, e.g., a main frame computer may be used. To the processing unit 101, a coordinate input unit 102, a pictorial image input unit 103 and a character code input unit 107 are connected as the input device, and a display unit 104, a line drawing output unit 105 and a color hard copy unit 106 are connected as the output device. The coordinate input unit 102 is a device which inputs the cross section of the cubic receptacle as two-dimensional coordinates, and may be constituted, e.g., with a digitizer, a tablet, a mouse, and a write pen etc. The pictorial image input unit 103 is a device which inputs the original drawing of the pattern of the label attached on the surface of the cubic receptacle as binary pictorial image or color gradation pictorial image data, and may be constituted, e.g., with a scanner or a CCD camera etc. On the other hand, the character code input unit 107 is a device which inputs character data of the label attached on the cubic receptacle, and may be constituted, e.g., with a word processor connected to a computer as the processing unit 101. The character code input with the word processor will be converted to character font in the computer thereafter to be combined with pattern data. Moreover, the display unit 104 is a device which displays the two-dimensional projected image and the pattern of the cubic receptable, and further displays instructions required for an operator. This display unit 104 may be constituted with a plurality of displays corresponding to contents to be displayed. For instance, a monochromatic display and a high resolution color display can be used for displaying the condition of the cross section input of the cubic receptacle and its wire frame diagram and for displaying the two-dimensional projected images of the label and the receptacle on which the label is attached, respectively.

The line drawing output unit 105 is a device which outputs, onto a paper, the two-dimensional projected image of the cubic receptacle as the line drawing, i.e., the wire frame diagram, and may be constituted, e.g., with an XY plotter which handles a two-dimensional projected image as a vector pictorial image. In addition, the color hard copy unit 106 is a device which outputs the two-dimensional projected image of the picture pattern or the cubic receptacle on which the pattern is attached onto a paper with color representation, and may be constituted, e.g., with a film recoder or a color printer etc. which handles the two-dimensional projected image as a raster pictorial image.

With such a designing apparatus, the cubic receptacle will be designed as follows. Initially, a cross sectional form of the receptacle is input from the coordinate input unit 102. The result thus input is displayed on the display unit 104 and whether or not moldability, dimension and capacity etc. are suitable is judged by the processing unit. Thus, correction of the coordinate input is repeated until the form which is in conformity with the requirement of a person who has given the order is obtained. The finally accepted form is output from the line drawing output unit 105 as the wire frame diagram. Then, an original drawing of the label is input from the pictorial image input unit 103 and the character code input unit 107. A pattern described by a designer is loaded on a scanner etc. and is convertd to two-dimensional data. Thus, characters are input from the word processor etc. as character codes and are converted to character fonts. They are displayed on the display unit 104, respectively. At this stage, necessary correction and coloring are conducted. A hard copy of the colored label can be obtained with the color hard copy unit 106. When the position on the cubic receptacle on which the label is to be attached and its area are input, the processing unit 101 links data indicative of the form of the cubic receptacle with data indicative of the label to output the two-dimensional projected image of the cubic receptacle on which the label is attached with color representation. If necessary, correction is made thereto to finally output the hard copy from the color hard copy unit 106. The hard copy thus obtained is presented to the person who has given the order.

Figure 1:
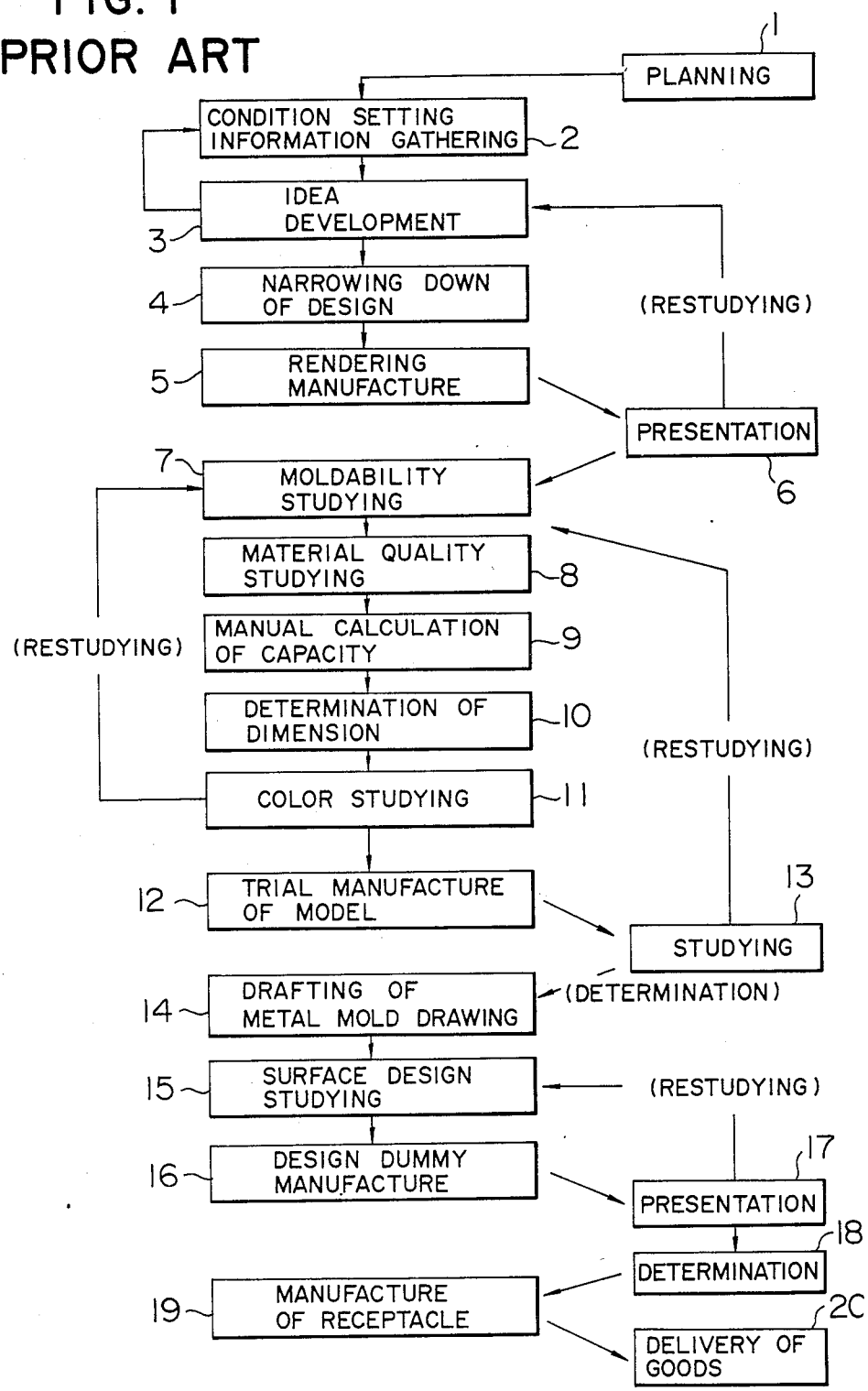
FIG. 1 is a block diagram illustrating a designing process according to the conventional method.
Figure 8:
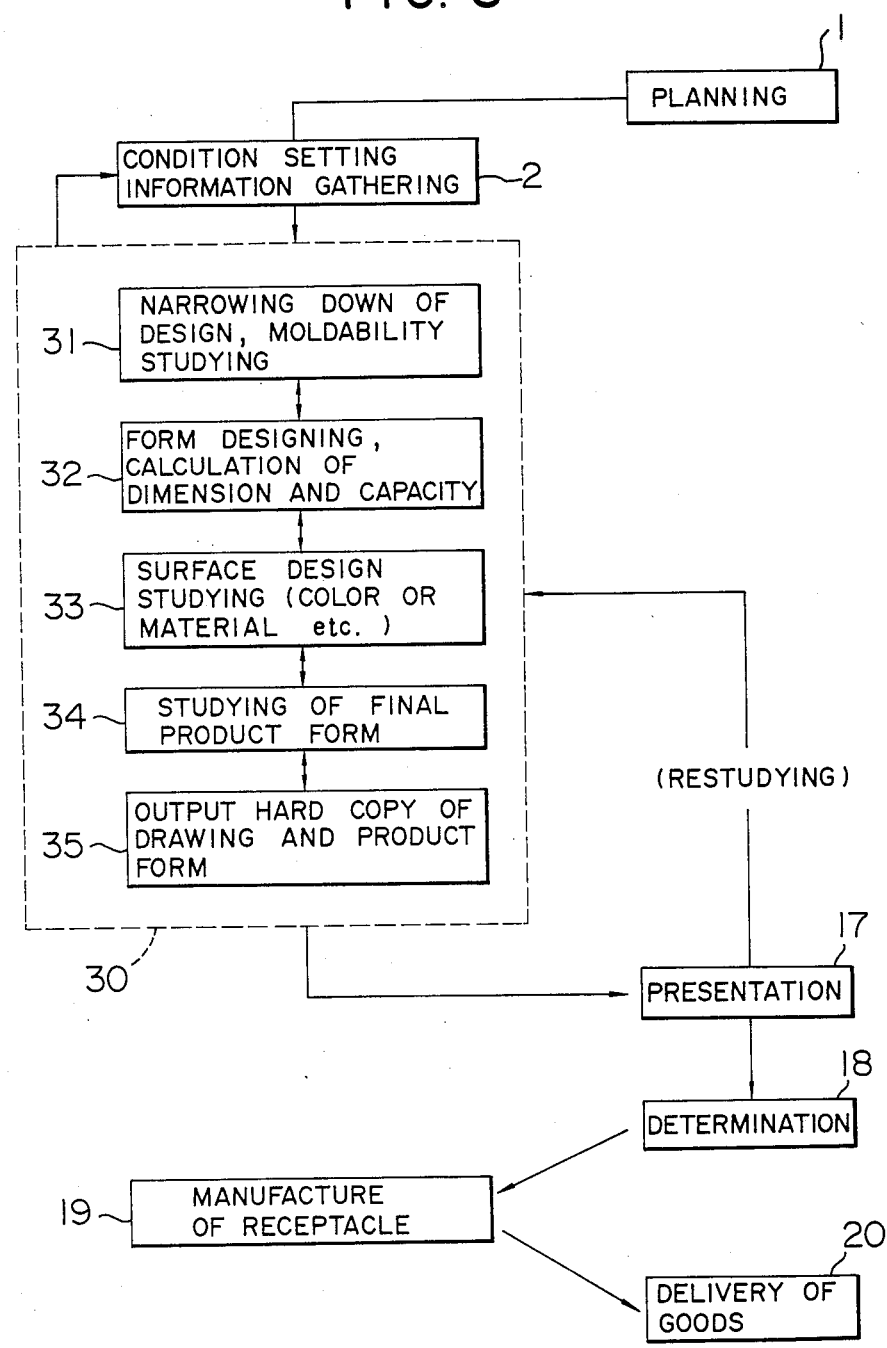
FIG. 8 is a block diagram showing a designing process based on a method according to the present invention.

FIG. 8 is a block diagram showing the process for designing a cubic receptacle using the above-described designing apparatus. When compared to the conventional designing process shown in FIG. 1, it is seen that the total process has been quite simplified. Initially, planning 1 is presented by a person who gives an order for a receptacle to effect condition setting/information gathering 2. Then, a designing step 30 using the designing apparatus according to the present invention is implemented on the basis of the above information. Namely, narrowing down of design and moldability studying 1 and form designing and calculation of dimension and capacity 32 are first carried out. This is accomplished as previously described by inputting the cross sectional form from the coordinate input unit 102 to correct the input indicative of the form with reference to the form and various calculated results displayed on the display unit 104. Subsequently, a surface design studying 33 is carried out on the basis of the label input from the pictorial image input unit 103 and the character code input unit 107 to conduct a study 34 on the form of a final product on which the label is attached to finally output a hard copy 35 of the drawing and the product form. The designing step 30 stated above can be implemented by only applying a predetermined operation to input/output equipment of the designing apparatus by an operator, resulting in no need to actually conduct trial-manufacturing of a model or to manufacture a design dummy as in the conventional designing method. When the hard copy output is finally obtained, presentation 17 which presents it to the person who has given the order is conducted. If restudying is required, the designing step 30 is carried out for a second time. In this instance, necessary correction is only implemented to the data having been previously input, thus enabling change of the design. The presentation to the person who has given the order is only carried out in the form of a color hard copy of a two-dimensional projected image of the cubic receptacle on which the label is attached in a manner stated above. Thus, the person who has given the order can always check the product using a completed drawing. When determination 18 of the final form and the pattern is made, receptacle manufacturing 19 is implemented and delivery of goods 20 is then conducted. Thus, various processes in the conventional method shown in FIG. 1 are all inclusively implemented at the designing step 30, and this step is easily executed in an extremely short time using the computer.

As stated above, in accordance with the designing apparatus according to this embodiment, the cross section of the cubic receptacle and the original drawing of the label attached thereon are input to the computer as two-dimensional data to implement necessary correction thereto, thereafter to link these data to output the two-dimensional projected image of the cubic receptacle on which the label is attached, thus making it possible to lessen labor and time required for design.

<Best mode for determining the amount to be contained and the material amount of the receptacle>

In the designing method explained on the basis of the flowchart shown in FIG. 2, a mode for determining the amount to be contained and the material amount at step S3 will be described. Generally, most of cubic receptacles are receptacles formed as a body of revolution. An embodiment which will be described shows the best mode when the method at step S3 in FIG. 3 is applied. It is to be noted that the present invention is applicable to receptacles except for body of revolution.

Figure 9:
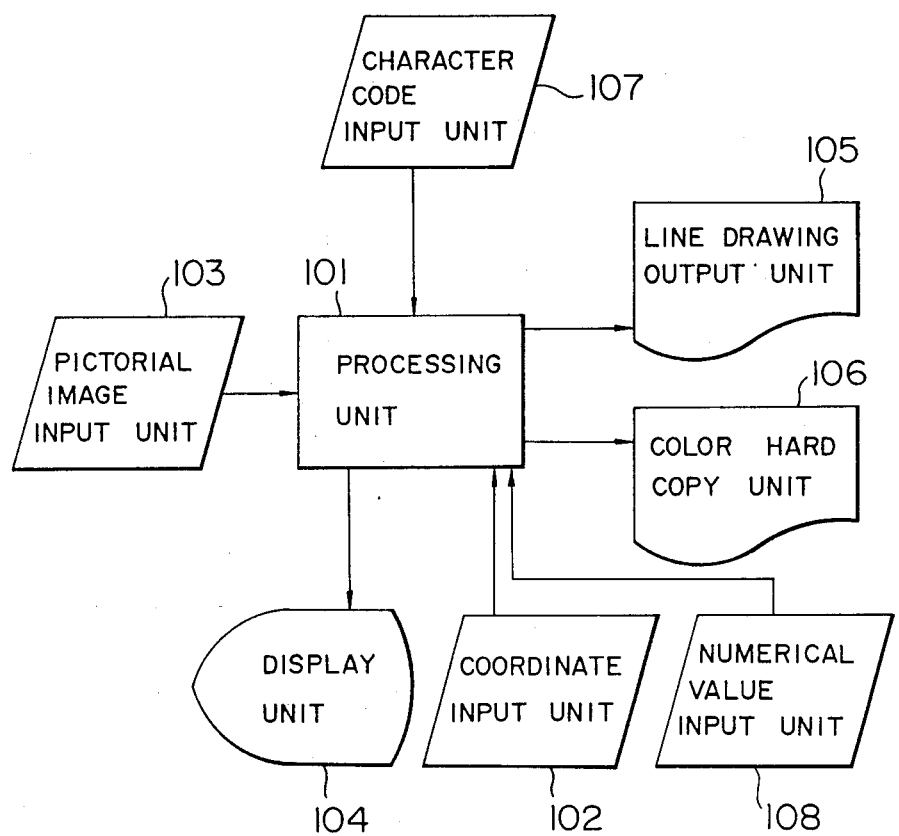
FIG. 9 is a block diagram illustrating another embodiment of an apparatus according to the present invention.

FIG. 9 is a block diagram illustrating an arrangement of an apparatus according to this embodiment. This apparatus is constituted by adding a numerical value input unit 108 to the apparatus shown in FIG. 7. For implementing the mode according to this embodiment, the processing unit 111, the coordinate input device 102, the numerical value input device 108 and the display 104 are used. For the numerical input unit 108, a keyboard or a menu region etc. of a digitizer may be used.

Figure 10:
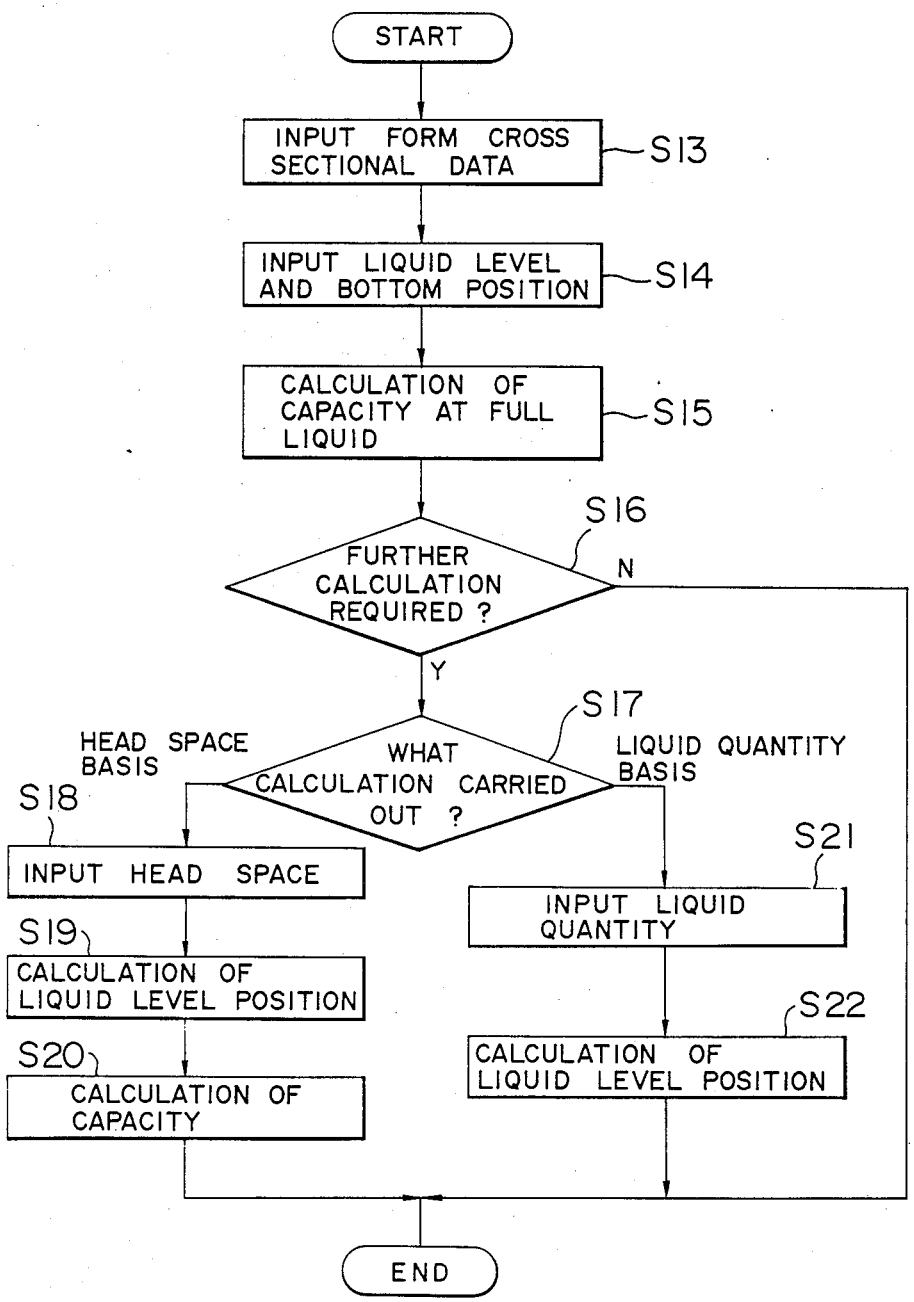
FIG. 10 is a flowchart showing the capacity calculating operation in the apparatus shown in FIG. 9.
Figure 11A:
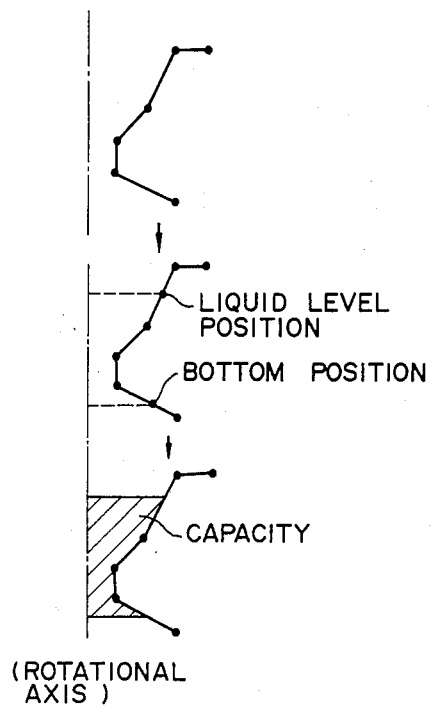
FIGS. 11(a), 11(b) and 11(c), are explanatory views showing the operation in FIG. 10 in a concrete manner, respectively.
Figure 11B:
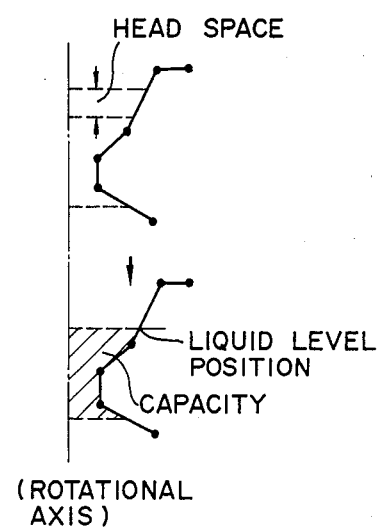
Figure 11C:
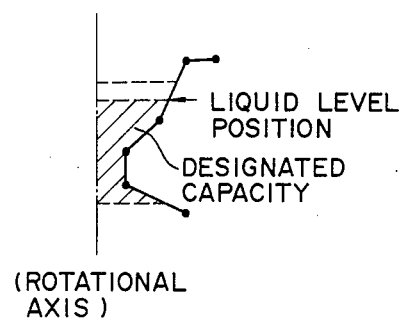

FIG. 10 is a flowchart showing the computing operation relating to the receptacle content among the operation contents in the apparatus shown in FIG. 9. FIGS. 11(a) to 11(c) are explanatory views showing the computational operation in a concrete manner, respectively.

In this apparatus, first is to input data indicative of the cross sectional form using the coordinate input unit 102 (S13). Such an input is performed by inputting coordinates indicative of vertices of the half of the longitudinal cross section (right half in this case) of the receptacle with respect to the rotational axis designated in advance. Subsequent to this, a liquid level and a bottom position are input (S14). The liquid level indicates a liquid surface position when liquid is poured into the receptacle. As shown in the central portion in FIG. 11(a), predetermined points on the line defining the form cross section are designated by the coordinate input unit. Thus the apparatus calculates the capacity of hatched portions of the figure shown at the bottom portion (S15). This hatched portion indicates the capacity when the receptacle is fully filled with liquid.

One possibility is that the receptacle designing is thus completed. Another possibility is that the receptacle designing is completed after the calculation of capacity when the head space is determined or determination of a liquid level position when the amount of liquid is determined is further carried out.

Thus whether or not calculation is further required is confirmed at step S16 (S16). When not required, the operation is completed. In contrast, when required, the operation shifts to step S17.

At step S17, whether the internal capacity of the receptacle based on the head space input should be calculated or the liquid level position based on the input of the amount of liquid should be calculated is judged to shift to either of the calculations. Namely, when the head space, i.e., the size of the space provided above the liquid is input using the coordinate input unit as shown by the upper portion in FIG. 11(b) (S18), a new liquid level position is calculated as shown by the figure located below in FIG. 11(b) (S19), and the capacity calculation based on the change in the liquid level is carried out (S20). On the other hand, when the amount of liquid is input by the numerical value input unit (S21), the liquid level position corresponding to the amount of the liquid is calculated (S22). FIG. 11(c) shows this relationship.

Figure 12:
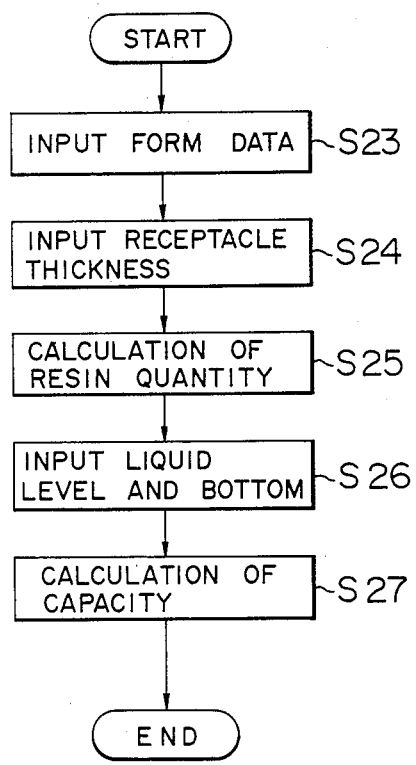
FIG. 12 is a flowchart showing the operation for calculating resin amount in the apparatus shown in FIG. 9.
Figure 13:
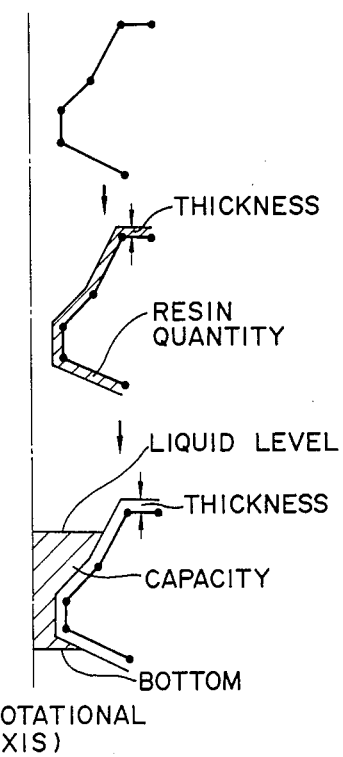
FIG. 13 is an explanatory view showing the operation in FIG. 12 in a concrete manner.

FIG. 12 is a flowchart showing the computational operation relating to the amount of resin among the operation contents in the apparatus shown in FIG. 9. FIG. 13 is an explanatory view showing the content of the computational operation thereof in a concrete manner.

Also in this case, form data is input using the coordinate input apparatus (S23). Thus, the uppermost figure is input. Then, the receptacle thickness is input using the numerical value input unit (S24). Thus, the processing unit calculates the amount of resin (S25). The hatched portion of the figure at the central portion in FIG. 13 indicates the thickness of the receptacle and the amount of resin will be determined in accordance with the thickness. Then, when a liquid level is input using the coordinate input apparatus (S26), the calculation on the capacity is carried out (S27). The figure shown lowermost in FIG. 13 indicates the liquid level and the capacity.

The outline of the calculations on the capacitor and the amount of resin has been explained as stated above and its detailed explanation will be now made in conjunction with FIGS. 14 to 20.

Figure 14:
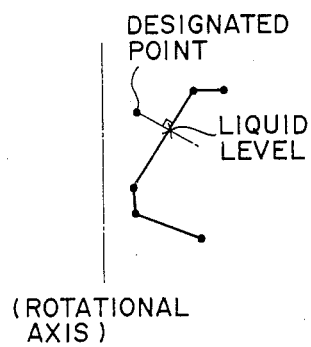
FIG. 14 is an explanatory view for a method of determining a liquid level based on the capacty calculation.

FIG. 14 shows a method of determining the liquid level and the bottom. When a point is designated in the inner side of a form line of a receptacle, a point on the form line which is the shortest from the designated point denotes the position of the liquid level or the bottom.

Figure 15:
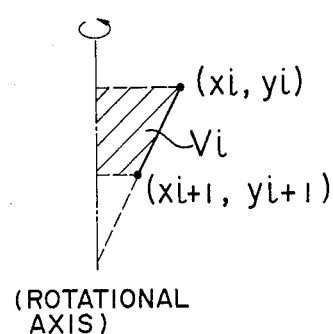
FIG. 15 is a view for explaining the capacity calculation.

FIG. 15 is a view for explaining the capacity calculation. The capacity of the turbinated or inverted cone formed by coordiantes $(x_i, y_i)$ and $(x_{i+1}, y_{i+1})$ with the rotation shaft being as center as shown is obtained as $$V_i = \pi/3 \times (y_i - y_{i+1}) \times (x_i^2 + x_i x_{i+1} + x_{i+1}^2) \tag{1}$$

Figure 16:
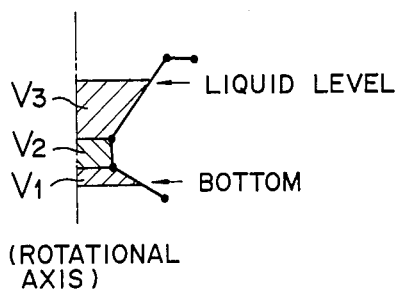
FIGS. 16 to 18 are views for explaining a method of determining the receptacle internal capacity, respectively.
Figure 17:
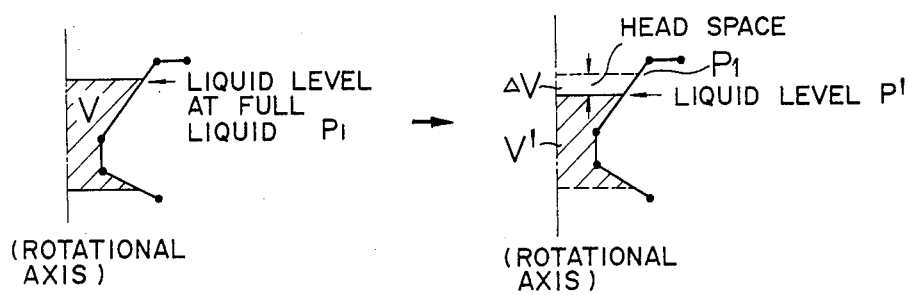
Figure 18:
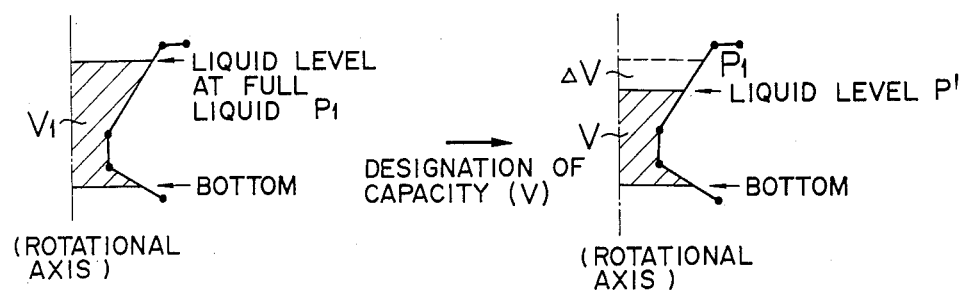

FIGS. 16 to 18 show methods of determining internal capacity of the receptacle wherein the methods in the respective figures are different from each other.

Among them, FIG. 16 shows the method based on the designation of the liquid level position. Upon determination of the liquid level by the liquid leel determination method shown in FIG. 14, capacity is calculated by the capacity determination method shown in FIG. 15. In this instance, since the form line indicates a hand drum-shaped receptacle, the capacity calculation is carried out with the receptacle being divided into $V_1$, $V_2$ and $V_3$.

Moreover, FIG. 17 shows the method based on the designation of the head space. To carry out this, first is to designate a liquid level position when the receptacle is fully filled with liquid using the method shown in FIG. 14 to designate a distance between the position at full liquid and height of the liquid surface thereby to determine the position of the liquid level to determine the internal capacity. Namely, assuming that the capacity V at full liquid has been determined in advance, a capacity $\Delta V$ corresponding to the head space is obtained by usin the method shown in FIG. 15, thus to perform computation of $(V - \Delta V)$.

In addition, FIG. 18 shows the method based on the designation of the internal capacity. After the liquid level on the bottom side when the position of the pilot line $P_1$ at full liquid using the method shown in FIG. 14 is designated is fixed, the internal volume V is input, thereby determining the position of a liquid level $P'$ on the liquid side.

Figure 19:
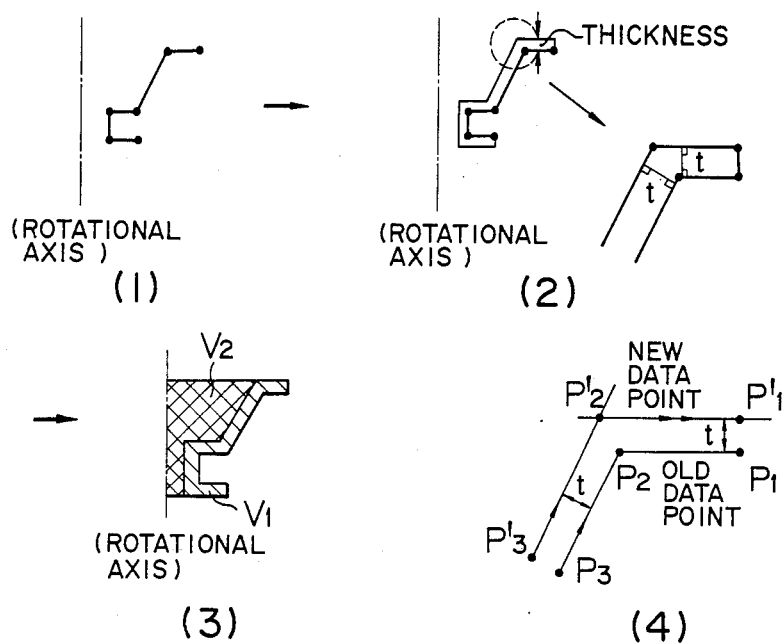
FIGS. 19 and 20 are views for explaining a method of determining resin amount and a method of determining the internal capacity in consideration of the resin amount.
Figure 20:
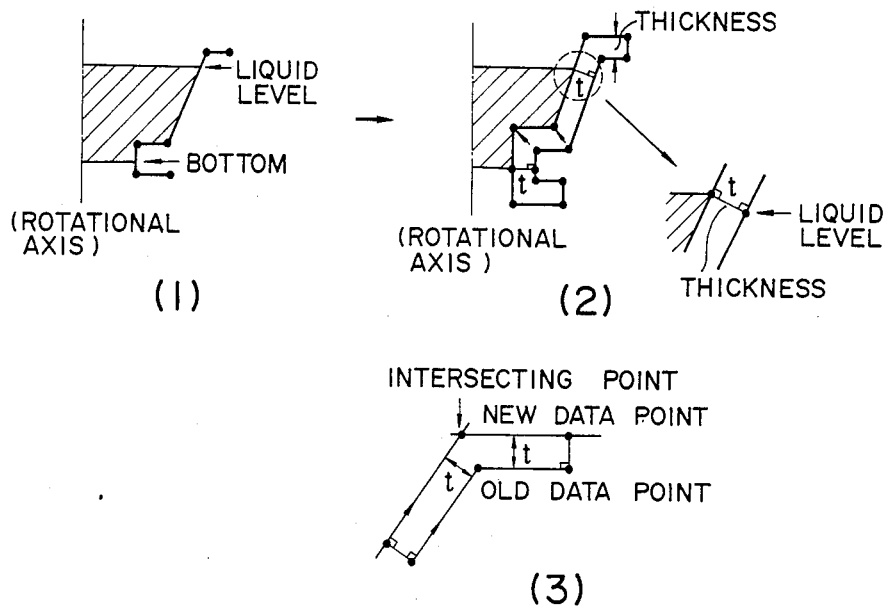

FIGS. 19 and 20 show a method of determining the amount of resin and a method of determining internal capacity in consideration of the amount of resin.

In these methods, FIG. 19 shows the method of determining the amount of resin. The receptacle thickness is designated with respect to the form data in FIG. 19(1) thereby to obtain the figure in FIG. 19(2) to subtract internal capacity $V_2$ from a capacity $V_1$; including the thickness to obtain a resin amount $V_r$.

Here, to obtain the thickness, as shown in FIG. 19(4), a straight line parallel to a straight line connecting data points and having a distance t with respect thereto is obtained to use intersecting points of these straight lines as cross section data.

Moreover, FIG. 20 shows a method of determining internal capacity in consideration of the thickness of the receptacle. The thickness of the receptacle is designated with respect to form data in FIG. 20(1) to obtain cross section data in FIG. 20(2) thus to determine internal capacity. The method of determining the thickness in this case is based on FIG. 20(3) similar to FIG. 19(4).

As stated above, this embodiment is implemented to input position data such as cross sectional form of the receptacle using the coordinate input apparatus to input numeric data, e.g., receptacle capacity or receptacle thickness etc. using the numeric data input unit to perform computational processing while displaying the input contents on the display, thereby to evaluate the receptacle capacity or the resin amount etc. Accordingly, when compared to the conventional designing work including desk work or actually manufacturing process, this embodiment can carry out the receptacle designing with an extremely higher efficiency.

<Best mode for determining the form of the receptacle>

Here, in the designing method which has been explained on the basis of the flowchart shown in FIG. 2, one mode for determining the form at steps S1, S2 and S4 will be described. An embodiment which is described here shows the best mode in connection with the receptacle of the body of revolution similar to the above-described embodiment, but the present invention is applicable to receptacles except for bodies of revolution.

For implementing the mode according to this embodiment, the processing unit 101, the coordinate input unit 102, the numerical value input unit 108 and the display unit 104 are used in the same manner as in the above-described embodiment in the block diagram shown in FIG. 9.

Figure 21:
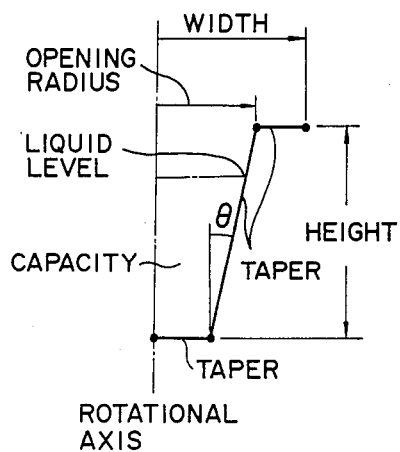
FIG. 21 is a view illustrating one example of a representative receptacle of body of revolution handled in the apparatus according to the present invention.

FIG. 21 shows an example of a representative form of the receptacle handled in the apparatus according to the present invention wherein the cross sectional form of only the left half with the rotational axis being as center is shown. In this figure, height represents the maximum size in the direction of the rotational axis, width represents the maximum size in a direction perpendicular to the rotational axis direction of the receptacle, opening radius represents a radius of the opening end of the liquid containing portion, capacity represents a capacity from the bottom of the liquid containing portion to the liquid level i.e. the liquid surface position when the liquid is filled, and taper represents an inclination of each component defining the form.

FIGS. 22 to 32 show receptacle form determination methods carried in the apparatus according to the present invention, respectively, and they have relationships as shown in the following table.

Figure 22:
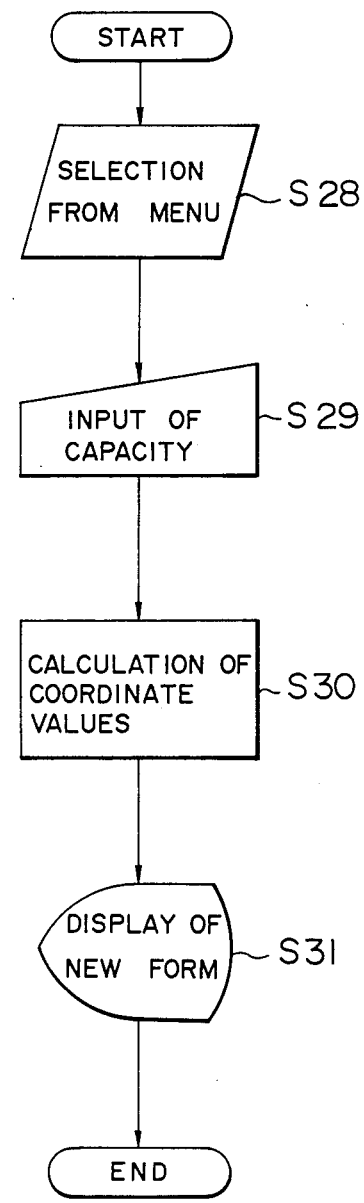
FIGS. 22 to 32 are flowcharts showing various operations in the method of determining the form of the receptacle of body, of revolution using the apparatus according to the present invention, respectively.
Figure 23:
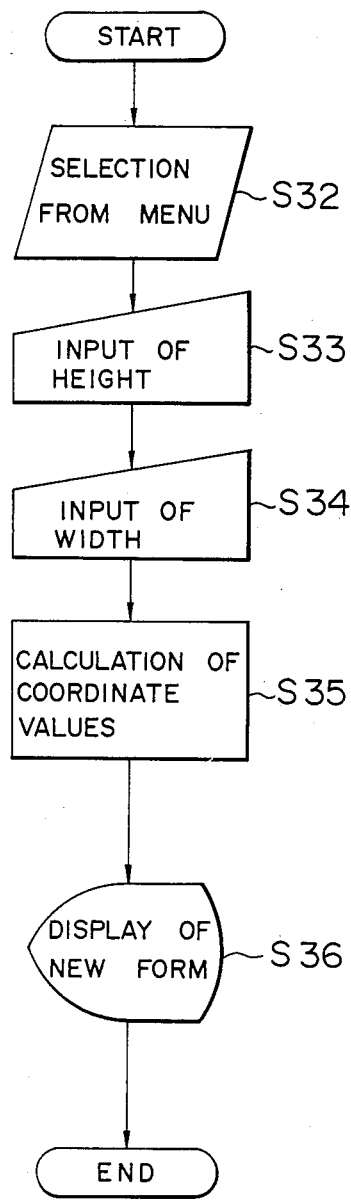
Figure 24:
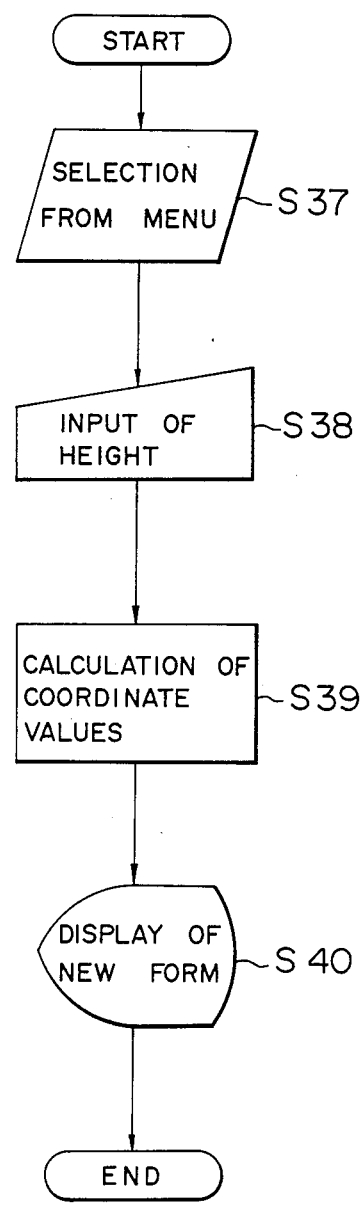
Figure 25:
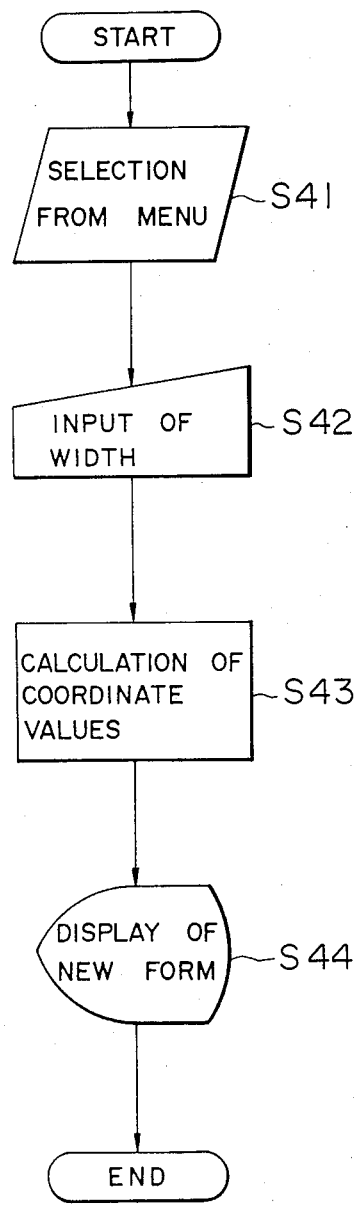
Figure 26:
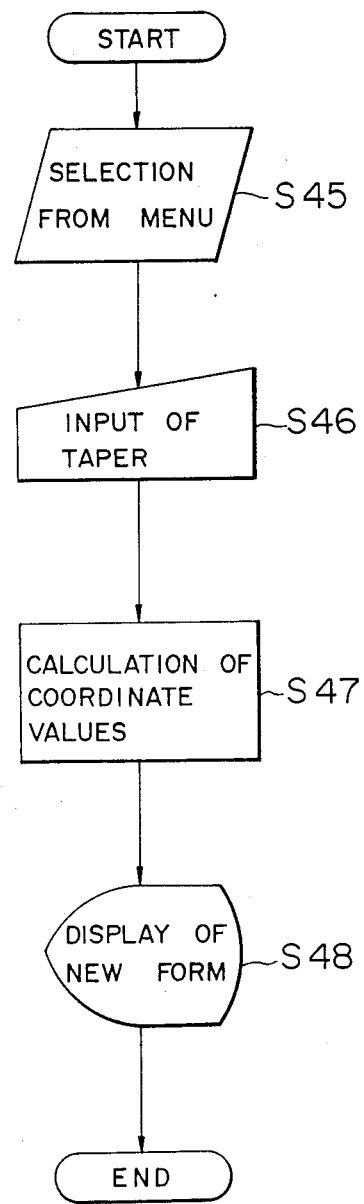
Figure 27:
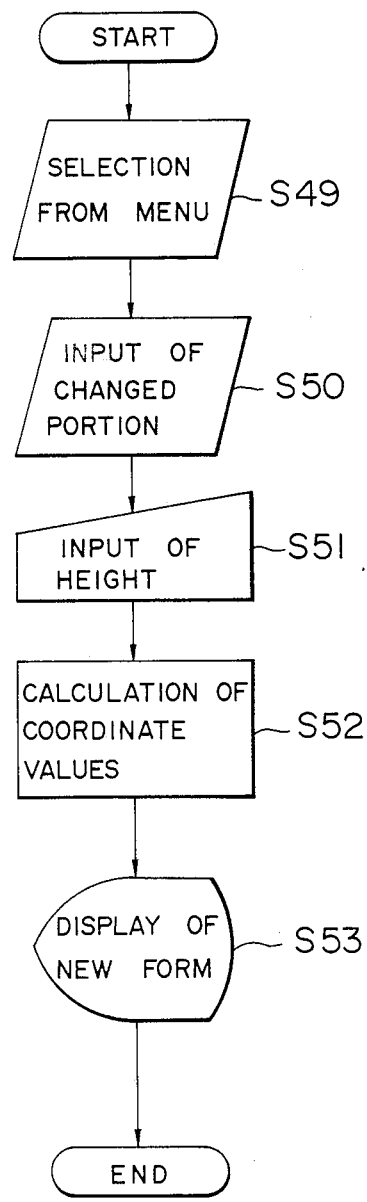
Figure 28:
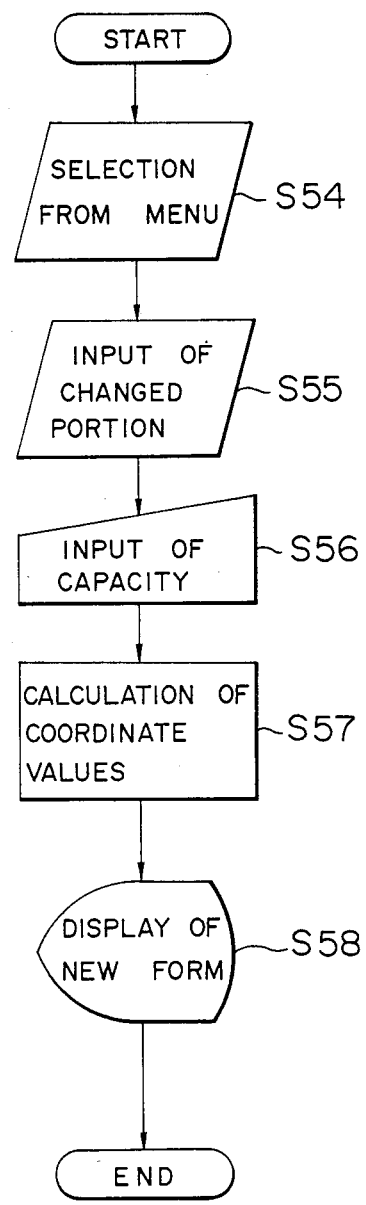
Figure 29:
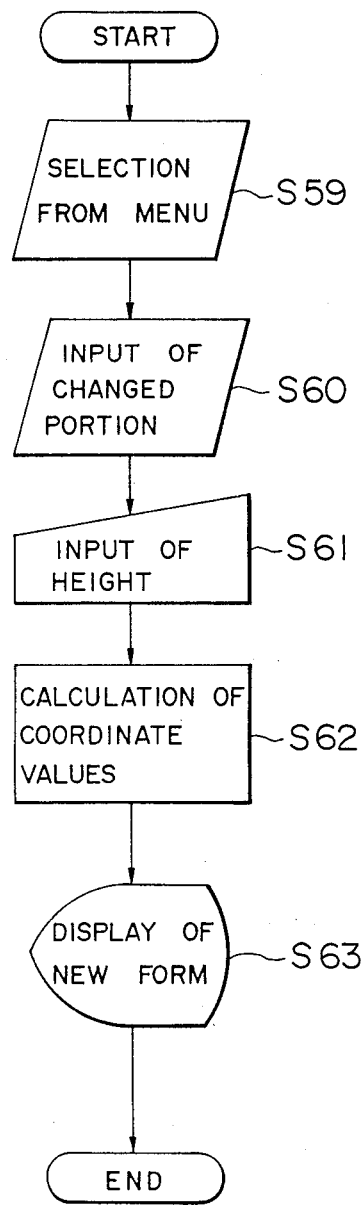
Figure 30:
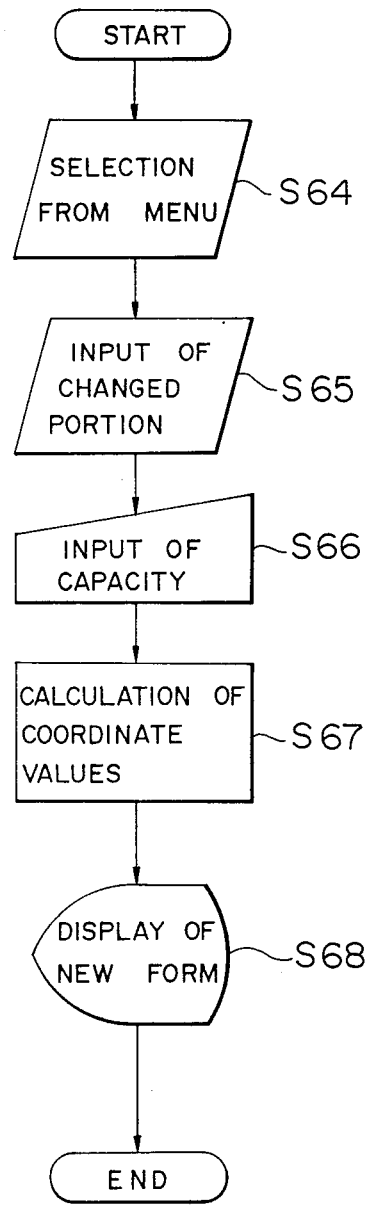
Figure 31:
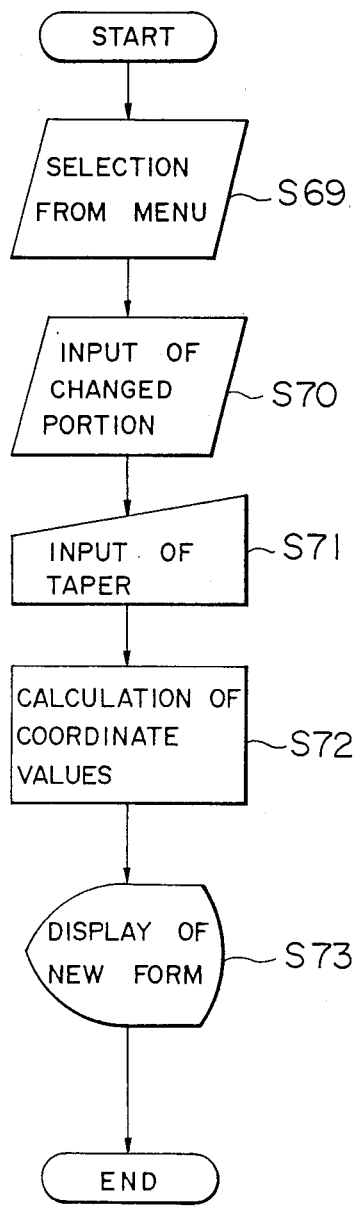
Figure 32:
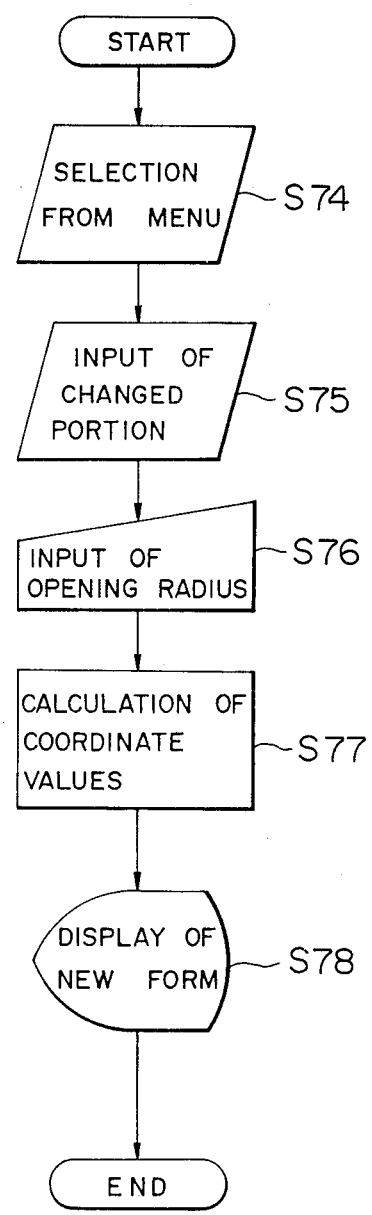

|  | Designated items | Fixed items |
| --- | --- | --- |
| FIG. 22 | Capacity | Taper |
| FIG. 23 | Height, width | None |
| FIG. 24 | Height | Capacity |
| FIG. 25 | Width | Capacity |
| FIG. 26 | Taper | Capacity |
| FIG. 27 | Partial height | Width, partial form |
| FIG. 28 | Capacity | Width, partial form |
| FIG. 29 | Partial height | Taper, partial form |
| FIG. 30 | Capacity | Taper, partial form |
| FIG. 31 | Taper | Capacity, partial form |
| FIG. 32 | Opening radius | Capacity, taper |

The operation contents will be described in connection with dimensions listed in the above Table, respectively. The explanation of contents shown in FIGS. 27 to 32 will be made in conjunction with FIGS. 33 to 36.

The method in FIG. 22 shows that taper is fixed and the capacity is designated. First is to select the content from the menu using the coordinate input apparatus (S28). Next is to input capacity using the numerical value input unit (S29). Thus, the processing unit calculates coordinate values (S30) to display its result on the display unit (S31).

Algorithm of the processing unit in this case is as follows:

$V_{old}$: old capacity $V_{new}$: new capacity $x_i, y_i$: old cross selection data $x_i, y_i'$: new cross section data $$x_i' = 3\sqrt{\frac{V_{new}}{V_{old}}} \times x_i \quad (2)$$

$$y_i' = 3\sqrt{\frac{V_{new}}{V_{old}}} \times y_i \quad (3)$$

The method in FIG. 23 shows that fixed item is absent, and height and width are designated. First is to select the content from the menu using the coordinate input unit (S32). Next is to input height and width using the numerical value input unit (S33, S34). Thus, the processing unit calculates the coordinate value (S35) to display its result on the display unit (S36).

Algorithm of the processing unit in this case is as follows:

$H_{old}$, $W_{old}$: old height and old width, respectively, $H_{new}$, $W_{new}$: new height and new width, respectively, $$h = H_{new}/H_{old} \quad (4),$$

$$w = W_{new}/W_{old} \quad (5),$$

$$x_i' = w \times x_i \quad (6), \text{ and}$$

$$y_1' = h \times y_i \quad (7).$$

The method in FIG. 24 shows that the capacity is fixed and height is designated. First is to select the content from the menu (S37) thereafter to input height (S38). Thus, the processing unit calculates the coordinate value (S39) to display its result on the display unit (S40).

Algorithm of the processing unit in this case is as follows:

$$h = H_{new}/H_{old}, \quad (8)$$

$$x_i = \sqrt{\frac{1}{n}} \times x_i, \text{ and} \quad (9)$$

$$y_i = h \times y_i. \quad (10)$$

The method in FIG. 25 shows that capacity is fixed and width is designated. First is to select the content from the menu (S41) thereafter to input width (S42). Thus, the processing unit calculates the coordinate value (S43) to display its result on the display unit (S44).

Algorithm of the processing unit in this case is as follows:

$$w = W_{new}/W_{old} \quad (11),$$

$$x_i' = w \times x_i \quad (12), \text{ and}$$

$$y_i = 1/w^2 \times y_i \quad (13).$$

The method in FIG. 26 shows that capacity is fixed and taper is designated. First is to select the content from the menu (S45) to input taper (S46). Thus, the processing unit calculates the coordinate value (S47) to display its result on the display unit (S48).

Algorithm of the processing unit in this case is as follows:

$$w = 3\sqrt{\frac{\tan\theta'}{\tan\theta}}, \quad (14)$$

where $\theta$ and $\theta'$ represent old and new tapers, respectively, $$x_i' = w \times x_i, \text{ and} \quad (15)$$

$$y_i' = 1/w^2 \times y_i. \quad (16)$$

The method in FIG. 27 shows that width and partial form are fixed and partial height is designated. First is to select the content from the menu using the coordinate input unit (S49) and to input a portion to be changed (S50), thereafter to input height using the numerical value input unit (S51). Thus the processing unit calculates the coordinate value (S52) to display its result on the display unit (S53).

Figure 33:
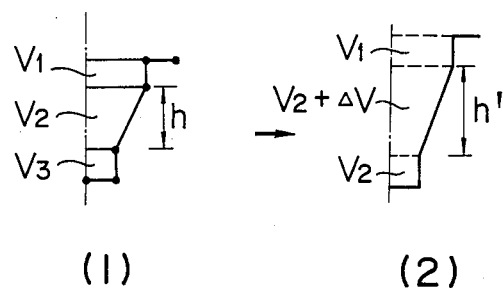
FIGS. 33 to 36 are views showing figures used for explaining the operation in FIGS. 27 to 32.

Algorithm of the processing unit in this case will be explained by using FIG. 33. It is now assumed that the height of the turbinated or inverted conical portion $V_2$ is changed from h to h' in the receptacle comprising two cylindrical portions $V_1$ and $V_3$ and the turbinated portion $V_2$ (changed from FIG. 33(1) to FIG. 33(2)). As a result, according to the height of the inverted conical porton $V_2$ is changed, the capacity and taper are also changed.

In connection with the method in FIG. 28, the explanation of the method in FIG. 27 is applicable thereto except that the step S51 for inputting height in the method in FIG. 27 is changed to step S56 for inputting capacity.

The method in FIG. 29 shows that taper and partial form are fixed and partial height is designated. First is to select the content from the menu (S59) and to input a portion to be changed (S60), thereafter to input height (S61). Thus the processing unit calculates the coordinate value (S62) to display its result on the display unit (S63).

Algorithm of the processing unit in this case will be explained by using FIG. 34. Assuming now that an original height and a designated height are represented by h and h', respectively, the figure after change when the original figure corresponds to that in FIG. 34(1) can take the forms in FIGS. 34(2) and 34(3). Namely, the width is changed in the case of FIG. 34(2), whereas the width is not caused to be changed in the case of FIG. 34(3). As a result, changes in the capacity are occurring. The contents of the algorithm are as follows:

The case of (2)

$P > P_1$
$x_i' = x_i$ (17)
$y_i' = y_i$ (18)

$P_1 < P < P_2$
$x_i' = x_i$ (19)
$y_i' = C_1 y_i + C_2$ (20)

$P > P_2$
$x_i' = x_i$ (21)
$y_i' = C_3 + y_i$ (22)

The case of (3)

$P < P_1$
$x_i' = x_i$ (23)
$y_i' = C_1 + y_i$ (24)

$P_1 < P < P_2$
$x_i' = x_i$ (25)

-continued
$y_i' = C_2 y_i + C_3$ (26)

$P > P_2$
$x_i' = x_i$ (27)
$y_i' = y_i$ (28)

By evaluating $C_1$, $C_2$ and $C_3$ in connection with the reSpective cases, the form is determined.

FIG. 30 refers to the content in respect of the change in capacity and the explanation of FIG. 29 is applicable thereto except that the step S61 for inputting height in FIG. 29 is changed to step S66 for inputting capacity.

The method in FIG. 31 shows that capacity and partial form are fixed and taper is designated. First is to select the content from the menu (S69) and to input a portion to be changed (S70), thereafter to input taper (S71). Thus the processing unit calculates the coordinate value (S72) to display its result on the display unit (S73).

Figure 34:
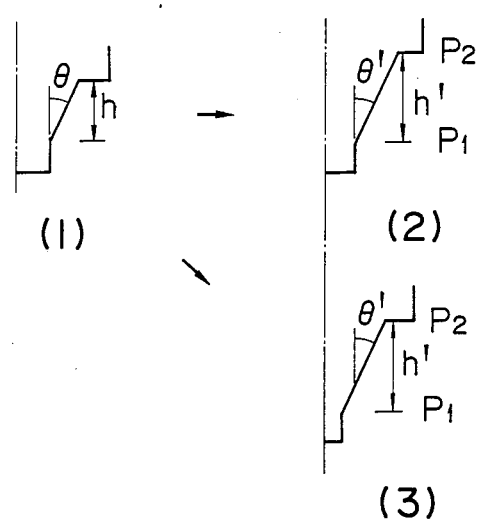
Figure 35:
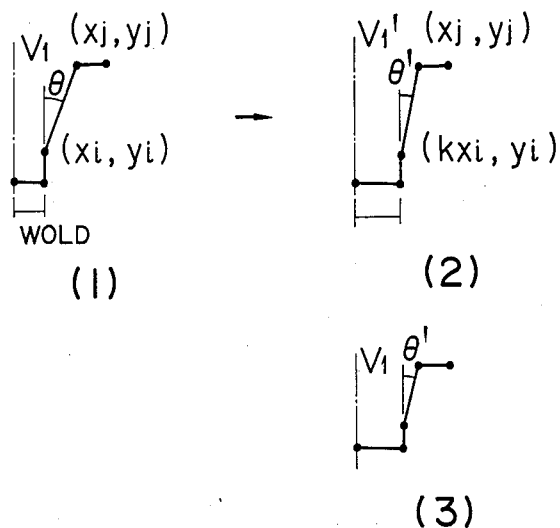

Algorithm of the processing unit in this case is shown in FIG. 35 and this is common to the algorithm in FIG. 34.

The method in FIG. 32 shows that taper and partial form are fixed and opening radius is designated. First is to select the content from the menu (S74) and to input a portion to be changed (S75), thereafter to input the opening radius (S76). Thus the processing unit calculates the coordinate value (S77) to display its result on the display unit (S78).

Figure 36:
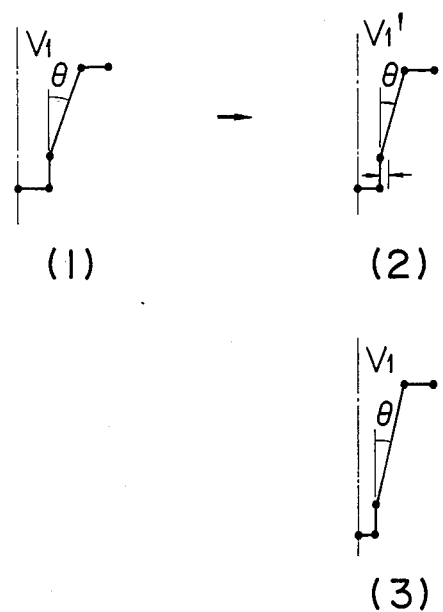

Algorithm of the processing unit in this case is shown in FIG. 36 and this is common to the algorithm in FIG. 34.

As stated above, this embodiment is implemented to input position data of elements constituting the cross sectional form of the receptacle and numeric data including the receptacle internal capacity thereby to compute coordinate values to display the receptacle form, thus making it possible to obtain with ease receptacle forms when the form constituent elements are altered, respectively, resulting in great contribution to the receptacle designing.

<Best mode for realizing two-dime.nsional representation of the cubic receptacle on which a pattern is attached>

Here, in the designing method which has been explained on the basis of the flowchart shown in FIG. 2, a best mode of the process shown at the step S11 will be explained. As previously described, in accordance with the designing method shown in the flow chart in FIG. 2, the form of the cubic receptacle is determined at the steps S1 to S6 and the patt.ern attached on the cubic receptacle is input at the steps S7 and S8. Accordingly, at step S11, a shadow diagram showing the condition that the input pattern is attached on the cubic receptacle as a label will be made up.

In other words, the work at the step S11 can be said to be the work which represents the cubic receptacle as three-dimensional figure using the two-dimensional representation given by the shadow diagram. Such a technique for two-dimensionally representing the three-dimensional figure is extremely widely used in various fields. Particularly, a method of designing a cubic receptacle on which the pattern is attached using a computer is recently proposed. This method is to define a cubic receptacle using the three-dimensional coordinate system to project it on the two-dimensional plane to take in the pattern attached thereon as two-dimensional data to compose these respective data on the computer, thus to obtain a two-dimensional projected image of the cubic receptacle on which the pattern is attached.

Figure 37:
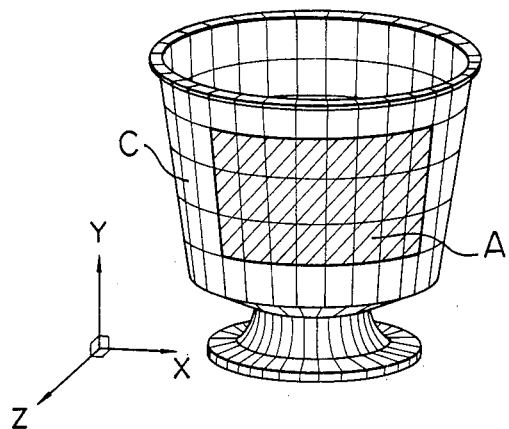
FIG. 37 shows a two-dimensional projected view of a cubic receptacle divided into infinitesimal surfaces.
Figure 38:
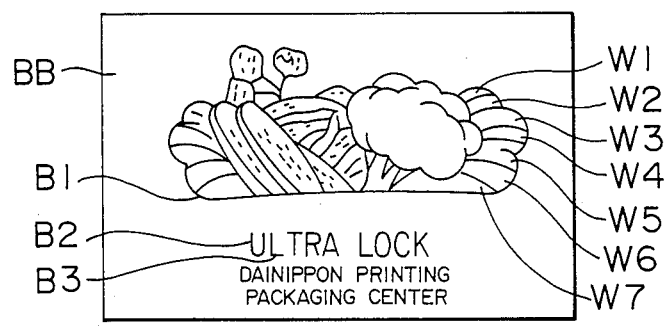
FIG. 38 shows a view of a pattern given as binary pictorial image.
Figure 39:
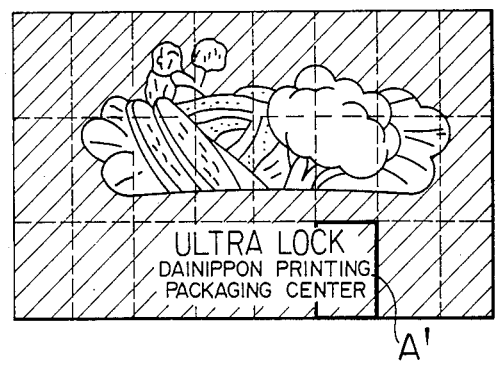
FIG. 39 is a view showing that the pattern is divided into infinitesimal surfaces.

However, there are two drawbacks with the conventional method. First drawback is that it is unable to represent in a two-dimensional manner the cubic receptacle on which a pattern which has been input as binary pictorial image and then colored is attached. Here, the binary pictorial image refers to a pictorial image obtained as set of pixels having either of binary digits, e.g., white or black. With the conventional method, when color picture pattern is attached, there can be employed only a method to input color pattern manuscripts using a scanner etc. to compose them. Second drawback is that it is unable to attach the pattern on the cubic receptacle with the background portion thereof being erased. For instance, in the case where a picture pattern as shown in FIG. 38 is attached on a receptacle as shown in FIG. 37, although it is preferable that an area indicated by slanting lines in FIG. 39 is displayed in a manner that the surface of the cubic receptacle originally looks transparent because this area corresponds to the background portion of the pattern, since all portions within the frame at the time of inputting the pattern manuscript is handled as the pattern with the conventional method, the background portions within the frame had been displayed with any color being applied thereto.

In accordance with the embodiment disclosed here, it is possible to represent the cubic receptacle on which a pattern which has been input as binary pictorial image and then colored is attached with the background portion of the pattern being erased.

Figure 40:
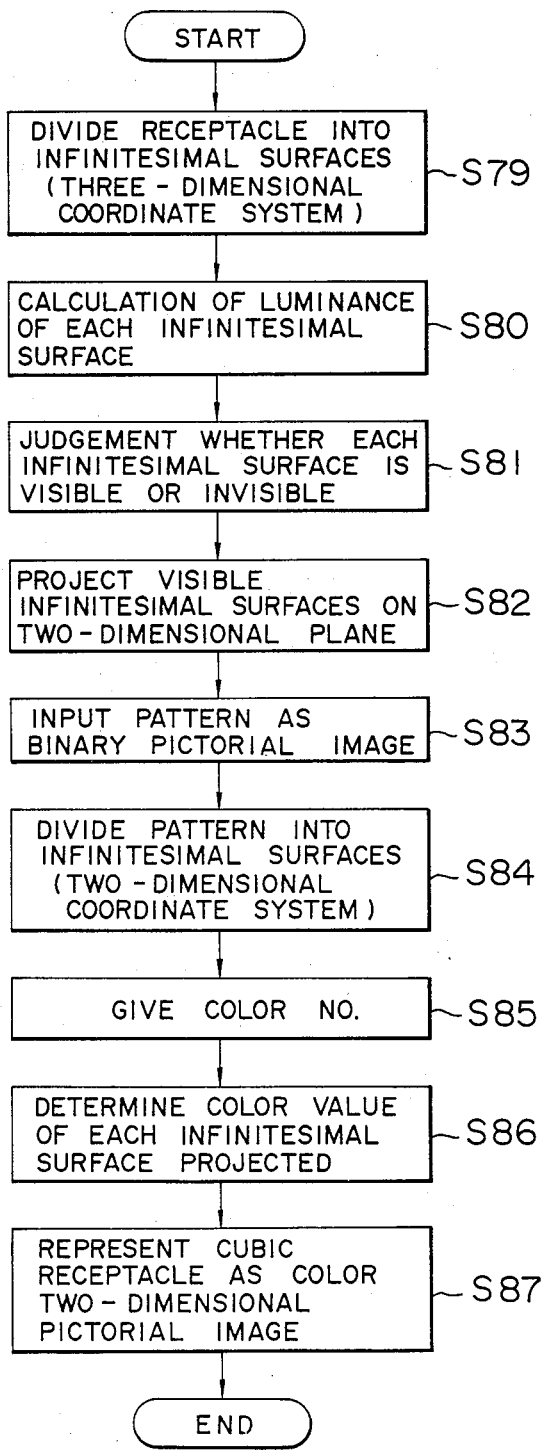
FIG. 40 is a flowchart showing an embodiment of a two-dimensionally representing method of a cubic receptacle of which a pattern is attached.

FIG. 40 is a flowchart of a method according to this embodiment wherein the entirety of the procedure of the flowchart corresponds to the step S11 in FIG. 2. Initially, at step S79, a cubic receptacle is divided into a plurality of infinitesimal surfaces. For instance, in the case of a cup as shown in FIG. 37, the cubic receptacle is divided into mesh-shapedssegments as shown. Since such a division is carried out by directly using the three-dimensional coordinate system, the back of the cup (which is partially illustrated in the figure) is also divided, with the result that infinitesimal surfaces exist. It is to be noted that coarse division is conducted for convenience of explanation in FIG. 37, but extremely fine division is actually to be carried out.

Subsequently, at step S80, luminance of each infinitesimal surface is calculated. Namely, position of a light source, position of the visual point and the like are set to calculate luminance I of each infinitesimal surface on the basis of the following equation:

$$I = I_a + K_d \sum_{j=1}^{m} (\vec{N} \cdot \vec{L_j}) + K_s \sum_{j=1}^{m} (\vec{E} \cdot \vec{L_j'})^n, \quad (29)$$

where $I_a$ represents luminance based on a scattered light of ambient environment, $K_d$ a diffusion reflection factor, $\vec{N}$ a unit norm vector on the material surface, $\vec{L_j}$ a unit vector in a direction of the light source on the j-th surface, $K_s$ a specular reflection factor, $\vec{L_j'}$ a unit vecotor of a regularly reflected light of the j-th light source, $\vec{E}$ a unit vector in a direction of the visual point, n an index dependent upon brilliance of the object surface, and m the number of light sources. In the equation (29), the first term of the right side is a background light component, the second term thereof is a diffusion reflection component, and the third term is a specular reflection component. Since this model is described in detail in "Illumination for Computer Generated Pictures" by Phong, C. ACM (1975), pp. 311 to 317, detailed explanation is omitted here. When there is a need to represent an impression of material quality with respect to each infinitesimal surface of the cubic receptacle, it is sufficient to set values of $K_d$ and $K_s$ in the equation (29) to suitable values in consideration of the impression of material quality.

Then, at step S81, a judgement whether each infinitesimal surface is visible or invisible is made. It is sufficient for this to carry out processing, e.g., using Z buffer algorithm. The Z buffer algorithm is a method to compare Z-coordiante values indicative of depth in the figure shown in FIG. 37 with each other to judge whether each depth is a portion which can be viewed from the visual point or a portion which cannot be viewed therefrom. Since this method is the conventionally well known method, detailed explanation is omitted here.

Subsequently, at step S82, visible infinitesimal surfaces are projected on the two-dimensional plane. Namely, the cubic receptacle represented by XYZ is projected on the XY plane. For the method of projecting the three-dimensional material object on the two-dimensional plane, wide variety of methods using various coordinate systems are known. Accordingly, its explanation is omitted here.

Then, at step S83, a pattern is input as binary pictorial image. It is sufficient to take in a pattern as shown in FIG. 38, for example, as data having binary digits of white and black. In actual, this work has been already completed at the steps S7 and S8 of the flowchart shown in FIG. 2.

Subsequently, at step S84, the pattern thus input is divided into infinitesimal surfaces. This is a division carried out in the two-dimensional coordinate system as indicated by broken lines in FIG. 39. In addition, when this pattern is attached on the cubic receptacle, the infinitesimal surfaces of the cubic receptacle and the infinitesimal surfaces of the pattern are caused to have positionally one-to-one correspondence relationship. For instance, when consideration is taken into the case where the pattern in FIG. 39 is attached to portions indicated by slanting lines of the cubic receptacle shown in FIG. 37, the infinitesimal surface A of the cubic receptacle in FIG. 37 corresponds to the infinitesimal surface A' of the pattern shown in FIG. 39. Since such a division is extremely fine in actual as previously described, one infinitesimal surface in FIG. 39 is not a large area like the infinitesimal surface A' but an area approximately corresponding to one pixel.

Then, at step S85, color numbers are given to respective infinitesimal surfaces of the pattern shown in FIG. 39. Since each infinitesimal surface is a unit surface corresponding to one pixel as previously described, it is not efficient to give color numbers to these infinitesimal surfaces, respectively. Thus, it is preferable to divide the pattern into a plurality of closed areas to designate color number per each closed region to give the same color number collectively to the infinitesimal surface within the closed area thus designated. The pattern shown in FIG. 38, for example, is composed of two areas of white and black. First, color numbers are given to white closed areas encircled by black, respectively. W1 to W7 in the figure denote the white closed areas, as an example. For designation of color numbers, for instance, a pattern is displayed on a color display and an operator designates in turn color numbers of respective areas while observing the display, thus to constitute a system so that the areas are filled with colors corresponding to the designated color numbers. The operator can easily correct the color numbers by making use of the feedback of coloring display by the display. When the color number designation is completed in regard to the white closed areas, color number designation in regard to the black closed areas is conducted. B1 to B3 in the figure are the black closed areas, as an example. Color number indicative of background is further designated to the infinitesimal surface within the area BB of the background portion of the pattern. Thus, color numbers are given to all the infinitesimal surfaces of the color picture.

Then, at step S86, color value of each infinitesimal surface of the cubic receptacle projected as shown in FIG. 37 is determined. The determination of the color value is made by employing the following three methods depending upon the attribute of the infinitesimal surface.

(1) The case of the infinitesimal surface on which the pattern is not attached

For instance, in the case of the infinitesimal surface on which a pattern like the infinitesimal surface C in FIG. 37 is not attached, color value is determined on the basis of at least the body color and luminance of the infinitesimal surface. For instance, it is sufficient to effect RGB representation of material color having lightness corresponding to luminance. In addition, by further using a value indicative of an impression of material quality as a parameter, color value may be determined.

(2) The case of the infinitesimal surface on which an infinitesimal surface to which a color number indicative of background is given is attached For instance, in the case of the infinitesimal surface of the cubic receptacle on which infinitesimal surfaces within the area BB in FIG. 38 are attached, color determination may be made in the same manner as in the item (1). Thus the surface of the cubic receptacle is represented as it is on the area indicated by slanting lines in FIG. 39.

(3) The case of the infinitesimal surface on which an infinitesimal surface of the pattern to which color number indicative of color is given is attached For instance, in the case of the infinitesimal surface of the cubic receptacle on which infinitesimal surfaces within areas W1 to W7 in FIG. 38 are attached, color value is determined on the basis of at least luminance and color number. For instance, colors corresponding to respective color numbers may be defined in advance to determine lightness of the color in accordance with luminance to effect RGB representation. In addition, by further using a value indicative of an impression of material quality as a parameter, color value may be determined.

The detail of the above-described color value determination method will be explained in <the best mode for representing an impression of material quality> which will be described later.

Finally, at step S87, the cubic receptacle is represented as two-dimensional color pictorial image. Since color values have been already determined with respect to all the infinitesimal surfaces projected on the two-dimensional plane, such a representation is realized by representing respective infinitesimal surfaces with the color values. Since each infinitesimal surface corresponds to one pixel of the display as previously described, each pixel will be represented as color value of RGB data.

In a manner stated above, the two-dimensional representation of the cubic receptacle on which the pattern is attached can be conducted.

As stated above, in accordance with this embodiment, when representing in a two-dimensional manner a cubic receptacle on which pattern is attached, the cubic receptacle projected in a two-dimensional manner and the pattern which has been input as binary pictorial image and then colored are divided into infinitesimal surfaces with their having one-to-one correspondence, respectively, whereby color values of portions on which the pattern is not attached and portions on which the background of the picture pattern is attached are determined on the basis of the body color and luminance of the cubic receptacle, and color values of portions on which portions except for the background of the pattern are attached are determined on the basis of color numbers attached on the pattern and luminance. Accordingly, this enables two-dimensional representation of the cubic receptacle on which the pattern which has been input as binary pictorial image and then colored is attached with the background portion of the pattern being erased.

<Best mode for forming an image obtained by composing two-dimensional pictorial image and three dimensional form>

Here, in the designing method which has been explained on the basis of the flowchart shown in FIG. 2, a further different best mode of the process shown at the step S11 will be explained. In the above-described embodiment, the method for performing the two-dimensional representation of a cubic receptacle on which a pattern is attached has been explained. One method for forming an image indicating that a three-dimensional or cubic receptacle is disposed within a two-dimensional background pictorial image is disclosed herein.

For implementing the method according to this embodiment, the processing unit 101, the coordinate input unit 102, the pictorial image input unit 103, the display unit 104 and the numerical value input unit 108 are used among units shown in FIG. 9. For the pictorial image input unit 103, a scanner or a line sensor etc. is used to take in the two-dimensional background pictorial image. In the flowchart in FIG. 2, such a taking-in work is carried out at the steps S7 and S8. The form (which is referred to as a "primitive figure" herein) of the cubic receptacle to be combined with the background pictorial image is input using the coordinate input unit 102 or the numerical value input unit 108. In the flowchart in FIG. 2, the primitive figure is input at the steps S1 to S6. Composition is carried out in the processing unit 101 and the pictorial image which has undergone composition is displayed on the display unit 104. Accordingly, an operator can perform conversion of the primitive figure on the basis of the interactive system while observing a displayed pictorial image on the display unit 104.

Figure 41:
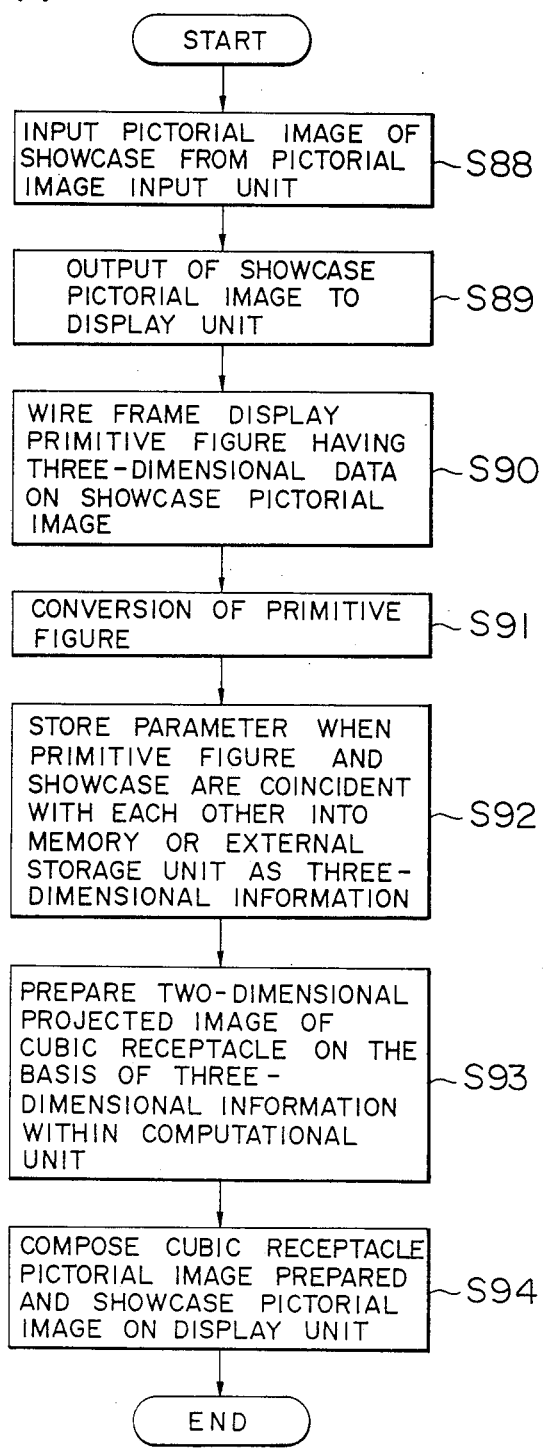
FIG. 41 is a flow chart showing an embodiment of a method of forming an image in which the two-dimensional pictorial image and three-dimensional form are composed.

FIG. 41 is a flowchart showing the contents of the method according to this embodiment wherein figures handled at respective steps in the flowchart are shown in FIGS. 42(a) to 42(d), as an example. In this example, a pictorial image of a showcase is used as a background two-dimensional pictorial image S and a cylindrical material object is used as a primitive figure p to be composed.

First, a pictorial image e of the showcase is input using the pictorial image input unit (S88). This data is stored into a memory of the computational unit and is displayed on the display unit (S89). The displayed image is the image shown in FIG. 42(a).

Figure 42A:
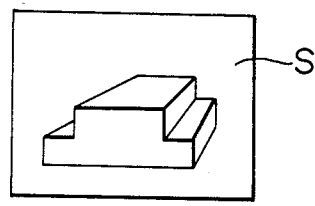
FIGS. 42(a), 42(b), 42(d) are views showing examples of pictorial images at steps S89, S90, S93 and S94 respectively, in the method as shown in FIG. 41.
Figure 42B:
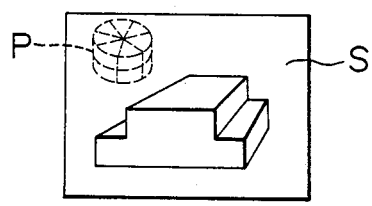
Figure 42C:

Then, by step S90, three-dimensional data of the primitive figure is input using the coordinate input unit with the pictorial image of the showcase being displayed on the display unit, or data of the primitive figure having three-dimensional data stored in advance is read to effect wire frame display. FIG. 42(b) shows the displayed pictorial image at this time.

While observing the displayed pictorial image, an operator operates the coordinate input unit or the numeral input unit to perform conversion of the primitive figure (S91). For conversion contents, there are, for example, rotational angle, visual point position, size, penetration condition, positional coordinates, and the like, and light source position or texture etc. may be further added.

Figure 42D:
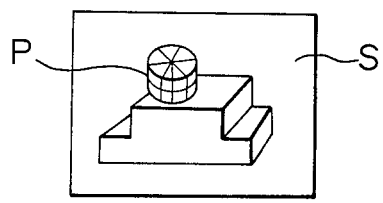

When it is recognized that the primitive figure and the showcase are coincident with each other from a viewpoint of the operator's sense as a result of the conversion operation, an input parameter by the coordinate input unit or the numerical value input unit etc. at that time is stored into a memory of the computational unit by step S92. This input parameter has been taken in as three-dimensional data. The computational unit forms the two-dimensional projected image of the primitive figure on the basis of the three-dimensional data (S93). This figure is the figure shown in FIG. 42(c). Then, the computational unit composes the two-dimensional projected image of the primitive figure and the pictorial image indicative of the showcase to display the composite image on the display unit (S94). FIG. 42(d) shows the final image displayed.

Thus, the composite image of the primitive figure and the showcase is obtained on the display unit. From this pictorial image, the composed result can be confirmed. In addition, the composite pictorial image may be output as a copy.

As described above, in accordance with this embodiment, an image obtained by composing the three-dimensional primitive figure and the background two-dimensional pictorial image is formed. Accordingly, composition simulation, e.g., a house with respect to scenery, an ornament with respect to a furniture, or the like can be simply and preferably carried out. Namely, because very complicated background two-dimensional pictorial image can be utilized and arbitrary three-dimensional data can be combined with the two-dimensional pictorial image under arbitrary conditions, the composed result becomes reasonable.

<Best mode for representing an impression of material quality>

Here, in the designing method which has been explained on the basis of the flowchart shown in FIG. 2, there is disclosed one mode of the process shown in the step S11, particularly one mode capable of representing an impression of material quality when a three-dimensional figure is represented in a two-dimensional manner.

The technique for representing the three-dimensional figure in a two-dimensional manner is the technique very widely used in various fields. The problem with this technique is how to represent an impression of material quality of a body constituting the three-dimensional figure. When light is irradiated to a body or a material object, manners of diffusion, reflection and transmission are different depending upon material used. Accordingly, the impression of material quality is generally represented using a technique which determines color of the image projected in a two-dimensional manner in consideration of the diffusion, reflection and transmission. However, the drawbacks with the conventional method are that sufficient representation of impression of material quality cannot be performed and representation of the impression of material quality which is different per each localized portion cannot be performed. In accordance with the embodiment which will be stated herein, when representing a three-dimensional figure in a two-dimensional manner, representation of a more faithful material quality impression can be performed and representation of the impression of material quality which is partially different can be attained.

Figure 43:
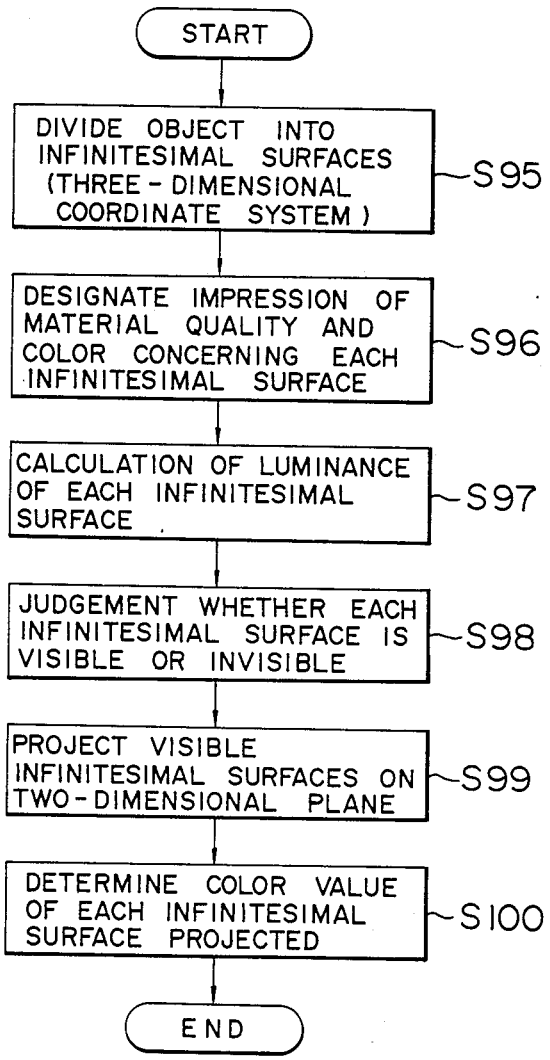
FIG. 43 is a flowchart showing an embodiment of a method of representing an expression of material quality when representing the three-dimensional figure in a two-dimensional manner.
Figure 44:
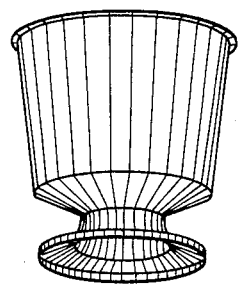
FIG. 44 is an explanatory view showing an example wherein a three-dimensional body is divided into infinitesimal surfaces; infinitesima

FIG. 43 is a flowchart of a method according to this embodiment. First, at step S95, a material object is divided into a plurality of infinitesimal surfaces. For instance, in the case of the cup as shown in FIG. 44, it is divided into mesh like segments as shown. Since such a division is performed in the three-dimensional coordiaate system as it is, the back (not shown in the figure) of the cup is also divided, with the result that infinitesimal surfaces exist.

Then, at step S96, impression of material quality and color with respect to each infinitesimal surface are designated. In the case of the cup shown in FIG. 44, it is permitted to change material quality per each localized portion, for example, in a manner that the receptacle portion and its leg portion are formed of plastic and metal, respectively. In addition, the designation of color enables representation of the cup with a pattern being attached on its surface. Although a coarse division is employed for convenience of explanation in the example shown in FIG. 44, if a more fine division is carried out, the pattern can be finely represented with each infinitesimal surface being as one pixel.

Subsequently, at step S97, luminance of each infinitesimal surface is calculated. Namely, the position of the light source, the position of the visual point and the like are set to evaluate luminance I of each infinitesimal surface on the basis of the following equation:

$$I = I_a + K_d \sum_{j=1}^{m} (\vec{N} \cdot \vec{L_j}) + K_s \sum_{j=1}^{m} (\vec{E} \cdot \vec{L_j'})^n, \qquad (30)$$

where $I_a$ represents luminance by a scattered light of the ambient environment, $K_d$ diffusion reflection factor, $\vec{N}$ unit normal vector of the body surface, $\vec{L_j}$ the j-th unit vector in a directi the light source, $K_s$ specular reflection factor, $\vec{L_j'}$ unit vector of a regularly reflected light of the j-th light source, $\vec{E}$ unit vector in a direction of the visual point, n index dependent upon brilliance of the body surface, and m number of light sources. In the equation (30), the first term of the right side denotes background light component, the second term thereof diffusion reflection component, and the third term thereof specular reflection coponent. Here, the diffusion reflection factor $K_d$ in the second term and the specular reflection factor $K_s$ in the third term are determined depending upon the impression of material quality of each infinitesimal surface. For instance, when representing an impression of material quality, the value of $K_s$ becomes large, when the impression of earthenware is represented, the value of $K_d$ becomes large, and when the impression of plastic is represented, values of $K_s$ and $K_d$ are substantially equal to each other. Since this model is described in detail in "Illumination for Computer Generated Pictures" by Phone, C. ACM (1975), pp 311 to 317, the detailed explanation is omitted here.

Figure 45:
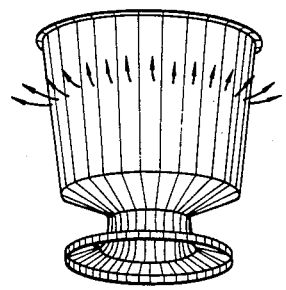
FIG. 45 is an explanatory view showing unit vectors normal to respective infinitesimal surfaces.

With respect to the infinitesimal surface having an opaqe material, luminance value will be calculated as follows. First, unit normal vector N of each infinitesimal surface is calculated. For instance, arrows as shown in FIG. 45 are obtained as vectors in the three-dimensional coordinate system. Subsequently, I1 in respect of each infinitesimal surface is calculated. This I1 is a value obtained by calculating the right side of the equation (30), assuming that only the first light source is installed. $I_a$ of the first term denotes background light component resulting from the first light source used, and a suitable value may be given. The values of $K_s$ and $K_d$ are determined depending upon material quality and thus the luminance I1 is calculated.

Then, I2 to Im in respect of respective infinitesimal surfaces are calculated. I2 is a value obtained by calculating the right side of the equation (30), assuming that only the second light source is installed. Likewise, Im is a value obtained by calculating the right side of the equation (30), assuming that only the m-th light source is installed. The luminance I in respect of respective infinitesimal surfaces is finally evaluated from the following equation:

$$I = I1 + I2 + \ldots + Im \qquad (31)$$

Figure 46:
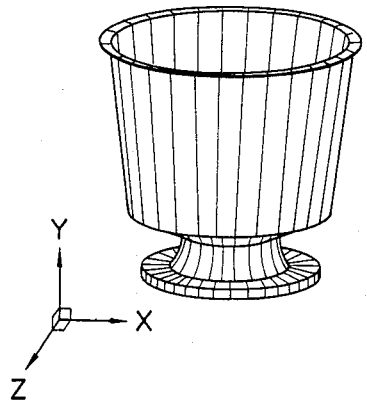
FIG. 46 is an explanatory view showing the manner in which a body is projected on the two-dimensional plane.

Then, at step S98, a judgement whether each infinitesimal surface is visible or invisible is made. It is sufficient for this to execute processing, e.g., using Z buffer algorithm. The Z buffer algorithm is a method to compare Z-coordinate values indicative of depth in the figure shown in FIG. 46 with each other to judge whether each portion is a portion which can be viewed from the visual point or a portion which cannot be viewed therefrom. Since this method is the conventionally well known method, its detailed explanation is omitted here.

Subsequently, at step S99, visible infinitesimal surfaces are projected on the two-dimensional plan. Namely, the cubic receptacle represented by XYZ is projected on the XY plane. For the method of projecting the three dimensional body on the two-dimensional plane, wide variety of methods using various coordinate systems are known. Accordingly, its explanation is omitted here.

Finally, at step S100, color values of respective infinitesimal surfaces projected are determined. This is accomplished as follows. First, the comparison between the diffusion reflection factor $K_d$ and the specular reflection factor $K_s$ with respect to the infinitesimal surface is made. Determination is conducted on the basis of its result by using different methods.

(1) The case of $K_d \approx K_s$

Figure 47:
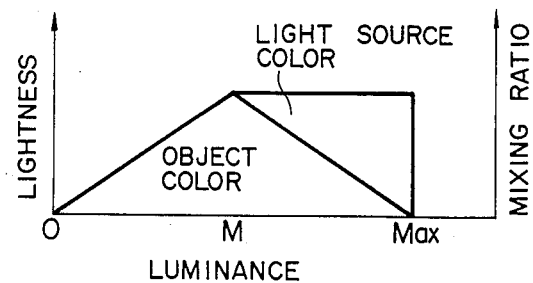

When the difference between $K_d$ and $K_s$ is less than about 10%, i.e., in the case of the infinitesimal surface on which the impression of material quality such as plastic is represented, luminance of the infinitesimal surface is referred to to determine color value on the basis of the graph shown in FIG. 47. First, an intermediate value M of luminance is determined. With respect to infinitesimal surfaces where luminance is equal to the intermediate value M, they are represented with body color having a predetermined lightness. According as luminance becomes lower, lightness is caused to be reduced. In contrast, according as luminance becomes higher from the intermediate value M, light source color is mixed with the body color, such a mixing being conducted so that the higher luminance is, the more the ratio of the light source color is. Thus, determination is carried out so that color of the infinitesimal color becomes body color having a predetermined lightness or a predetermined mixing ratio of the body color and the light source color.

(2) The case of $K_d > K_s$

In the case where $K_d$ is larger than $K_s$ to some extent, i.e., in the case of the infinitesimal surface to exhibit impression of material quality such as earthenware, luminance of the infinitesimal surface is referred to to determine color value on the basis of the graph shown in FIG. 48(a). Namely, the infinitesimal surface is represented by only the body color and color determination is carried out by allowing lightness to be higher according as luminance becomes higher.

(3) The case of $K_s > K_d$

In the case where $K_s$ is larger than $K_d$ to some extent, i.e., in the case of the infinitesimal surface to exhibit impression of material quality such as metal, color value is determined on the basis of the graph shown in FIG. 48(a) in the same manner as in the abovedescribed case (2).

In the case where the infinitesimal surface is formed of a transparent material, as shown in FIG. 48(b), when luminance is larger than the intermediate value M, it is preferable to represent the infinitesimal surface as a mixed color of the background color around the receptacle and the light source color and to increase the ratio of the light source color according as luminance becomes higher, on the other hand, when luminance is smaller than the intermediate value M, it is preferable to represent the infinitesimal surface as a mixed color of the background color and the body color and to increase the ratio of the body color according as luminance becomes lower. Since this method is described in the specification of Tokugansho No. 60-137016 which has been filed by the same applicant as the present invention, please make reference to this specification.

In a manner stated above, color value of each infinitesimal surface is determined and two-dimensional representation exhibiting impression of material quality is attained.

As stated above, in accordance with this embodiment, a method of representing impression of material quality when representing the three-dimensional figure in a two-dimensional manner is characterized in that the surface of the three-dimensional figure is divided into a plurality of infinitesimal surfaces to calculate luminance per each infinitesimal surface to carry out color determination using methods different from each other in connection with infinitesimal surfaces of an opaque material in which the diffusion reflection component and the specular reflection component are nearly equal to each other, infinitesimal surfaces of an opaque material in which the above components are different to some extent, and infinitesimal surfaces of a transparent material. Accordingly, this can perform more faithful representation of impression of material quality and perform representation of impression of material quality partially different.

<Best mode for forming vector data of character font>

Here, in the designing method which has been explained on the basis of the flowchart shown in FIG. 2, a best mode of the process shown in the steps S9 and S10 is disclosed.

When character is used as a portion of the label, font data of each character must be made up. For the conventional character font format, there are three forms shown in FIGS. 49 to 51. All of them relate to Chinese characters of the Japanese language meaning "mountain". The first form is that raster data shown in FIG. 49 is direcly used wherein pixels corresponding to the character of "mountain" among 5×5 pixels are assigned to black and the remaining pixels are assigned to white. The second form is based on run length data shown in FIG. 50 wherein the length of white or black data successive in a horizontal direction is expressed as the number of pixels. The third form is that 5×5 pixels which code conversion display with white and black corresponding to "0" and "1", respectively are displayed as hexadecimal digit and is configured as shown in FIG. 51.

However, these forms all have shortcomings. The first form using the raster data requires data per each pixel, resulting in a large quantity of data. The second form using the run length data and the third form based on code conversion make it difficult to vary the form of the character font in that when the form of the character font attempts to be varied, it must be once converted to raster data.

In accordance with the method according to this method, formation of character font capable of arbitrarily changing the form or size of the character font with less quantity of data is enabled.

FIG. 52(a) shows raster data of character handled in this embodiment, which is 7×7 pixel data having a coordinate value of 0 assigned to the X- and Y-axes, and coordinate values of −3 to 3 respectively assigned in directions of X- and Y-axes. This raster data is the character of "mountain" used in the above explanation.

FIG. 52(b) shows a scanning method in the case of scanning this raster data per each line wherein scanning is effected from minus to plus region in a direction of the X-axis line by line.

The vector data obtained by such a scanning are as shown in the following Table 1. Here, each data has a coordinate value of (x, y).

TABLE 1

| Initial Point | Terminal Point | None | | | |
|---|---|---|---|---|---|
| (0, 2) | (0, 2) | | | | |
| Initial Point | Terminal Point | | | | |
| (0, 1) | (0, 1) | | | | |
| Initial Point | Terminal Point | Initial Point | Terminal Point | Initial Point | Terminal Point |
| (−2, 0) | (−2, 0) | (0, 0) | (0, 0) | (2, 0) | (2, 0) |
| Initial Point | Terminal Point | Initial Point | Terminal Point | Initial Point | Terminal Point |
| (−2, −1) | (−2, −1) | (0, −1) | (0, −1) | (2, −1) | (2, −1) |
| Initial Point | Terminal Point | | | | |
| (−2, −2) | (2, −2) | None | | | |

Namely, the data indicative of the character of "mountain" appears on the second to sixth lines among 7×7 pixels. Accordingly, collection of solely the necessary data from the data in the above Table 1 and arrangement thereof result in contents shown in the following Table 2.

TABLE 2

| Initial point | (0, 2) | Terminal point | (0, 2) |
|---|---|---|---|
| " | (0, 1) | " | (0, 1) |
| " | (−2, 0) | " | (−2, 0) |
| " | (0, 0) | " | (0, 0) |
| " | (2, 0) | " | (2, 0) |
| " | (−2, −1) | " | (−2, −1) |
| " | (0, −1) | " | (0, −1) |
| " | (2, −1) | " | (2, −1) |
| " | (−2, −2) | " | (2, −2) |

By the vector data shown in Table 2, the character of "mountain" can be expressed with respect to X-Y coordinates including the origin. This data is relatively small in terms of data quantity. Because of vector data, such a data is suitable for geometrical conversion on processing and has a short processing time required, and reproducibility of the character form after conversion is good. In addition, the character font size is not limited.

As described above, in accordance with this embodiment, the raster data of character is scanned per each line to form vector data which expresses initial and terminal points of the character portion as coordianted values of the X-Y coordinate system with respect to the origin set on the character, thus making it possible to take out arbitrary character data using raster data difficult to process as it is. Accordingly, this system is incorporated into the pictorial image processing unit, thus making it possible to obtain various character pictorial images.

INDUSTRIAL APPLICABLILTY

A method of designing a cubic receptacle according to the present invention and an apparatus therefor can be widely utilized in the design of cubic receptacles for packaging various foodstuffs such as drinks and foods.

Particularly, an apparatus for determining internal capacity and material quantity of a receptacle and an apparatus for determining the form of a receptacle according to the present invention can be widely utilized in the design of receptacles, especially cubic receptacles which are formed as a body of revolution.

A method of representing in a two-dimensional manner a cubic receptacle on which a picture pattern is attached and a method of forming an image in which a three-dimensional form is composed on a two-dimensional pictorial image according to the present invention can be widely utilized in designing method to design a cubic receptacle while observing an image of the cubic receptacle represented in a two-dimensional manner. Further, they can be widely utilized in the representation methods for representing in a two-dimensional manner not only cubic receptacles but also general three-dimensional bodies.

Moreover, a method of representing impression of material quality according to the present invention can be widely utilized as the technique for representing impression of material quality in the representation methods for representing in a two-dimensional manner various three-dimensional bodies including cubic receptacles.

In addition, a method of preparing vector data of character font according to the present invention can be widely utilized in the technology for generally forming data of character font as a set of dots as well as character font used in a label attached on a cubic receptacle.

We claim:

1. A method of designing a cubic receptacle, comprising the steps of:
    inputting a cross section of the cubic receptacle as two-dimensional data to display a two-dimensional projected image of said cubic receptacle and calculate the capacity thereof on the basis of said two-dimensional data thus input to make a correction of the cross section of said cubic receptacle on the basis of the result, thus to determine the final form of said receptacle; and
    inputting an original picture of a label attached on the surface of said cubic receptacle as two-dimensional data to display the label on the basis of said two-dimensional data thus input to carry out correction of said label therefor on the basis of its result, thus to determine the final form of said receptacle linking the data indicative of said final receptacle form with the data indicative of the final label thereby to output a two-dimensional projected image of said cubic receptacle on which said label is attached.

2. A method of designing a cubic receptacle as set forth in claim 1, wherein said original picture attached on the surface of said cubic receptacle is divided into a pattern and a character to independently input these data thereof, respectively, to implement correction or coloring processing while displaying said label on the basis of the data thus input, thereby to determine the final label.

3. A method of designing a cubic receptacle as set forth in claim 1, wherein the longitudinal and lateral cross sections of said cubic receptacle are input as two-dimensional data.

4. A method of designing a cubic receptacle as set forth in claim 3, wherein the input of said longitudinal cross section is carried out by giving an instruction to designate a plurality of coordinate points in the two-dimensional coordinate system to connect respective coordinate points using a straight line or a curve.

5. A method of designing a cubic receptacle as set forth in claim 4, wherein the input of said lateral cross section is carried out by designating that said lateral cross section is circular.

6. A method of designing a cubic receptacle as set forth in claim 4, wherein the input of said lateral cross section is carried out by giving an equation representative of said lateral cross section.

7. A method of designing a cubic receptacle as set forth in claim 3 wherein the input of said lateral cross section is carried out by deslgnating combination of elementary geometrical figures, e.g., circle or square etc.

8. An apparatus for designing a cubic receptacle, comprising:
    a coordinate input unit which inputs a cross section of said cubic receptacle as two-dimensional coordinates;
    a label input unit which inputs an original picture of a label attached on the surface of said cubic receptacle as pictorial image data;
    a display unit which displays a two-dimensional projected image of said cubic receptacle, two-dimensional projected images of said label and said cubic receptacle on which said label is attached, and other instructions necessary for an operator;
    a line drawing output unit which outputs the two-dimensional projected image of said cubic receptacle as a line drawing;
    a color hard copy unit which outputs with color representation the two-dimensional projected image of said label; and
    a processing unit which performs a predetermined computation on the basis of data input from said coordinate input unit and said label input unit to provide data necessary for said display unit, said line drawing output unit, and said color hard copy unit.

9. An apparatus for designing a cubic receptacle as set forth in claim 8, wherein said label input unit includes a pictorial input unit which inputs, as pictorial data, a portion of a pattern of said original picture of said label attached on said cubic receptacle, and a character code input unit which inputs, as a character code, a portion of a character of said original picture of said label.

10. An apparatus for designing a cubic receptacle as set forth in claim 8, wherein said coordinate input unit includes a digitizer, a tablet, a mouse, or a write pen.

11. An apparatus for designing a cubic receptacle as set forth in claim 9, wherein said pictorial image unit includes a scanner or a CCD camera.

12. An apparatus for designing a cubic receptacle as set forth in any one of claim 9, wherein said character code input unit includes a word processor.

13. An apparatus for designing a cubic receptacle as set forth in claim 8, wherein said line drawing output unit handles said two-dimensional projectdd image as a vector pictorial image.

14. An apparatus for designing a cubic receptacle as set forth in claim 13, wherein said line drawing output unit includes an XY plotter.

15. An apparatus for designing a cubic receptacle as set forth in claim 8, wherein said color hard copy unit handles said two-dimensional projected image as a raster pictorial image.

16. An apparatus for designing a cubic receptacle as set forth in claim 15, wherein said color hard copy unit includes a film recoder or a color printer.

17. An apparatus for determining an internal capacity and an amount of material of a cubic receptacle comprising:
    a coordinate input unit to which position data of form components including a cross section of said receptacle with respect to center axis and a liquid level are input;
    a numerical value input unit to which numerical value data including data on a thickness of a wall of said receptacle are input;
    a processing unit which performs a computation on the basis of inputs from said coordinate input unit and said numerical value input unit to calculate at least one of a capacity of said receptacle and an amount of material required for manufacturing said receptacle, and to form data indicative of the receptacle form including said cross section and said liquid level of said receptacle; and a display which displays an output of said processing unit.

18. An apparatus for determining an internal capacity and an amount of material of a cubic receptacle as set forth in claim 17, wherein said coordinate input unit is comprised of a digitizer.

19. An apparatus for determining an internal capacity and an amount of material of a cubic receptacle as set forth in claim 17, wherein said coordinate input unit is comprised of a keyboard.

20. An apparatus for determining an internal capacity and an amount of material of a cubic receptacle as set forth in claim 17, wherein said numerical value input unit inputs the liquid level position and the bottom position of said receptacle.

21. An apparatus for determining the form of a receptacle comprising:
  a coordinate input unit to which position data of any element constituting the cross sectional form of said receptacle is input with respect to the center axis of the receptacle, a numerical value input unit to which numeric data including an internal capacity of the receptacle and a change in the above element are input, a processing unit which calculates coordinate values on the basis of inputs from said coordinate input unit and said numerical value input unit, and a unit which receives an output from said processing unit to display the form of said receptacle.

22. An apparatus for determining the form of a receptacle as set forth in claim 21, wherein said coordinate input unit inputs the height and the width of said receptacle.

23. An apparatus for determining the form of a receptacle as set forth in claim 21, wherein said coordinate input unit is comprised of a digitizer.

24. An apparatus for determining the form of a receptacle as set forth in claim 21 wherein said numerical value input unit is comprised of a key board.

25. A method of representing, in a two-dimensional manner, a cubic receptacle on which a pattern is attached, comprising the steps of:
  dividing the surface of said cubic receptacle into a plurality of infinitesimal surfaces;
  calculating luminance of each infinitesimal surface when irradiation is effected under a predetermined condition using a predetermined light source;
  projecting said cubic receptacle divided into a plurality of infinitesimal surfaces on a two-dimensional plane;
  inputting a pattern attached on said cubic receptacle as binary pictorial image;
  dividing said pattern thus input into a plurality of infinitesimal surfaces so as to correspond to the respective infinitesimal surfaces of said cubic receptacle with one-to-one relationship when said input picture is attached on said cubic receptacle;
  giving color numbers indicating background to infinitesimal surfaces of the background portion of said pattern and giving color numbers indicating colors of portions except for said background portion thereto;
  determining a color value in respect of the portion at which the picture pattern is not attached and the portion at which the infinitesimal surface of said pattern, to which color number indicating said background is given, is attached on the basis of at least a receptacle body color and luminance of the infinitesimal color among respective infinitesimal surfaces of the projected cubic receptacle, and determining a color value in respect of the portion at which the infinitesimal surface, to which color number indicating color is given, is attached on the basis of at least luminance and color number of the last-mentioned infinitesimal surface thereamong; and giving a color value to each infinitesimal surface constituting said cubic receptacle projected on the two-dimensional plane to represent said cubic receptacle as two-dimensional color image.

26. A method of representing, in a two-dimensional manner, a cubic receptacle on which a pattern is attached as set forth in claim 25, wherein a value indicating an impression of material quality of the infinitesimal surface is used as a parameter at the stage for calculating luminance of each infinitesimal surface.

27. A method of representing, in a two-dimensional manner, a cubic receptacle on which a pattern is attached as set forth in claim 25, wherein a judgement whether each infinitesimal surface is visible or invisible is made using Z buffer algorithm.

28. A method of representing, in a two-dimensional manner, a cubic receptacle on which a pattern is attached as set forth in any claim 25, wherein, at the stage for giving color number to said pattern, said pattern is divided into a plurality of closed areas to give the same color number per each closed area.

29. A method of representing, in a two-dimensional manner, a cubic receptacle on which a pattern is attached as set forth in claim 25, wherein a value indicating an impression of material quality of the infinitesimal surface is used as a parameter at the stage for determining a color value.

30. A method of forming an image in which a three-dimensional form is composed on a two-dimensional pictorial image, comprising the steps of inputting a two-dimenional pictorial image using a pictorial image input unit, displaying the input pictorial image on a display unit, projecting a primitive figure based on three-dimensional data on a two-dimensional plane on which said pictorial image is displayed, applying figure conversion to the primitive figure thus projected depending upon input conditions, forming a two-dimensional projected image of said primitive figure on the basis of a condition selected from said input conditions, composing said two-dimensional projected image and said input two-dimensional pictorial image, and displaying the composite pictorial image on said display unit.

31. A method of forming an image in which a three-dimensional form is composed on a two-dimensional pictorial image as set forth in claim 30, wherein said pictorial image input unit includes a scanner or a line sensor.

32. A method of representing an impression of material quality in the two-dimensional representation of a three-dimensional figure having a body color placed in a space having a predetermined background,
  wherein the surface of said three-dimensional figure is divided into a plurality of infinitesimal surfaces to calculate luminance of said each infinitesimal surface when light is irradiated under a predetermined condition using a predetermined light source by using the background component, the diffusion reflection component and the specular reflection component inherent in the material quality as parameters to evaluate an intermediate value of said luminance from the calculated result;

wherein, in respect to infinitesimal surfaces of an opaque material quality in which said diffusion reflection component and said specular reflection component are nearly equal to each other, when luminance is lower than said intermediate value, they are expressed with a body color having lightness corresponding to the luminance value, while when luminance is larger than said intermediate value, they are represented with a mixing color in which a light source color of said light source and said body color are mixed in accordance with the luminance value;

wherein, in respect to infinitesimal surfaces of an opaque material quality in which said diffusion reflection component and said specular reflection component are different to some extent, they are represented with said body color having lightness corresponding to the luminance value; and wherein, in the case where the infinitesimal surfaces have transparent material quality, in respect to infinitesimal surfaces having luminance larger than said intermediate value, they are represented as a mixing color of said light source color of said light source and said background color of said background and so that a ratio of said light source color is increased according to luminance becomes higher, and in respect to infinitesimal surfaces having luminance lower than said intermediate value, they are represented as a mixing color of said body color and said background color and so that a ratio of said body color is raised according as luminance becomes lower, thus replacing said three-dimensional figure with a two-dimensional pictorial image having an impression of material quality.

33. A method of representing an impression of material quality in the two-dimensional representation of a three-dimensional figure as set forth in claim 32, wherein luminance is calculated as sum of three components of said background light component, said diffusion reflection component and said specular reflection component.

34. A method of representing an impression of material quality in the two-dimensional representation of a three-dimensional figure as set forth in claim 32 or 33, wherein surface covering processing is carried out on the basis of Z buffer algorithm when replacing the three-dimensional figure with the two-dimensional pictorial image.

35. A method of representing an impression of material quality in the two-dimensional representation of a three-dimensional figure as set forth in claim 34, wherein in the case of carrying out the surface covering processing, when an infinitesimal surface of the same material quality as a transparent material quality or material quality different therefrom overlaps behind an infinitesimal surface of the transparent material quality, it is represented as a mixing color of color components of said both infinitesimal surfaces, and a color ratio of said infinitesimal surface positioned behind is increased according as transparency becomes higher and a color ratio of said infinitesimal surface positioned at the front side is increased according as transparency becomes lower, thereby replacing said three-dimensional figure with a two-dimensional pictorial image having a transparent impression of material quality.

36. A method of forming vector data of character front as set forth in claim 35, wherein raster data of character font is scanned per each line to take out coordinate values of the X-Y coordinate system with respect to the origin set on the character in regard to initial and terminal points of the character portion.

37. A method of forming vector data of character font as set forth in claim 36, wherein the origin of said X-Y coordinate system is positioned at the central portion of the character font.

38. A method of designing a cubic receptacle, comprising the steps of:

inputting a cross section of the cubic receptacle as two-dimensional data to display a two-dimensional projected image of said cubic receptacle and calculate the capacity thereof on the basis of said two-dimensional data thus input to make a correction of the cross section of said cubic receptacle on the basis of the result, thus to determine the final form of said receptacle; and inputting an original picture of a label attached on the surface of said cubic receptacle as two-dimensional data to display the label on the basis of said two-dimensional data thus input to carry out coloring processing for said label on the basis of its result, thus to determine the final form of said receptacle linking indicative of said final receptacle form with the data indicative of the final label thereby to output a two-dimensional projected image of said cubic receptacle on which said label is attached.

39. An apparatus for designing a cubic receptacle, comprising:

a coordinate input unit which inputs a cross section of said cubic receptacle as two-dimensional coordinates;

a label input unit which inputs an original picture of a label attached on the surface of said cubic receptacle as pictorial image data;

a display unit which displays a two-dimensional projected image of said cubic receptacle, two-dimensional projected images of said label and said cubic receptacle on which said label is attached, and other instructions necessary for an operator;

a line drawing output unit which outputs the two-dimensional projected image of said cubic receptacle as a line drawing;

a color hard copy unit which outputs with color representation the two-dimensional projected image of said cubic receptacle on which said label is attached; and a processing unit which performs a predetermined computation on the basis of the data input from said coordinate input unit and said label input unit to provide data necessary for said display unit, said line drawing output unit, and said color hard copy unit.

* * * * *